United States Patent [19]

Sumi

[11] 4,081,752
[45] Mar. 28, 1978

[54] DIGITAL FREQUENCY SYNTHESIZER RECEIVER

[75] Inventor: Yasuaki Sumi, Tottori, Japan

[73] Assignees: Sanyo Electric Co., Ltd.; Tottori Sanyo Electric Co., Ltd., both of Japan

[21] Appl. No.: 686,214

[22] Filed: May 13, 1976

[30] Foreign Application Priority Data

| May 30, 1975 | Japan | 50-65939 |
| May 30, 1975 | Japan | 50-65941 |
| Jun. 9, 1975 | Japan | 50-69840 |

[51] Int. Cl.² .......................................... H04B 1/32
[52] U.S. Cl. ..................................... 325/335; 325/470
[58] Field of Search ............... 325/335, 453, 458, 459, 325/464, 468, 470, 419; 334/15; 331/1 A, 4, 18, 25

[56] References Cited

U.S. PATENT DOCUMENTS

| 3,364,437 | 1/1968 | Loposer et al. | 325/335 |
| 3,803,494 | 4/1974 | Howell et al. | 325/459 |
| 3,845,394 | 10/1974 | Hamada et al. | 325/470 |
| 3,864,637 | 2/1975 | Kanow | 325/470 |
| 3,961,261 | 6/1976 | Pflasterer | 325/459 |
| 3,962,644 | 6/1976 | Baker | 325/470 |
| 3,971,992 | 7/1976 | Saikaishi et al. | 325/464 |
| 3,980,951 | 9/1976 | Breeze et al. | 325/419 |
| 4,027,251 | 5/1977 | Fathauer et al. | 325/453 |

Primary Examiner—Robert L. Griffin
Assistant Examiner—Marc E. Bookbinder
Attorney, Agent, or Firm—Darby & Darby

[57] ABSTRACT

A scanning type frequency synthesized receiver utilizing a voltage controlled oscillator (VCO) for producing a local oscillator signal. The control voltage for the VCO is provided in response to the division rate of a programmable divider. A control circuit programs the divider which control circuit operates to vary the divisor of the divider within a predetermined range as determined by information stored in a memory corresponding to a range of frequencies in a frequency band to be scanned and received by the receiver. Upon a command signal the control circuit operates to vary the divisor of the divider either up or down to cause the frequency of VCO, and thereby the receiver, to scan in a given direction and upon a signal being received the variation of the divider divisor and the receiver scanning is terminated. The VCO can be scanned either up or down in frequency, and the scanning can be either from the upper (or lower) end of a frequency range back to the lower (or upper) end and then reversed or a repetitive scanning from one end of the range to the other in the same direction. In the preferred embodiment disclosed is a multiband scanning receiver in which the stored information for the control circuit corresponds to the extremities of each of a plurality of frequency bands, the information corresponding to a particular band being utilized in response to selection of the band for reception by a band switching means.

39 Claims, 11 Drawing Figures

DIGITAL FREQUENCY SYNTHESIZER RECEIVER

BACKGROUND OF THE INVENTION

Field of the Invention

The present invention relates to a digital frequency synthesizer receiver employing a phase locked loop. More specifically, the present invention relates to an improved digital frequency synthesizer receiver employing a phase locked loop structured to be controllable in a sequential manner for the purpose of scanning of a given receiving band.

Description of the Prior Art

A typical prior art radio receiver comprises as a local oscillator for a tuner a parallel resonance circuit comprising a coil and a capacitor, in which the inductance of the coil or the capacitance of the capacitor is varied to obtain a desired tuning frequency. However, such a local oscillator is liable to suffer from the fluctuation of the oscillation frequency caused by a temperature characteristic of the coil, capacitor and the other oscillator components. Thus, it is rather difficult to obtain a stabilized oscillation frequency.

A digital frequency synthesizer has also been proposed and in practical use. Such a frequency synthesizer is much more advantageous in that it can provide a much more stabilized oscillation frequency. A typical frequency synthesizer employs a phase locked loop, which is often simply referred to as "PLL".

A frequency snythesizer employing a phase locked loop usually comprises a voltage controlled oscillator the oscillation frequency of which is controllable as a function of an output voltage, as low pass filtered, obtainable from a phase detector, which is adapted to compare the phase or the frequency of the output from a reference oscillator and the phase or the frequency of the output from a programmable frequency divider adapted to frequency divide the output frequency from the said voltage controlled oscillator at the frequency division rate which is adapted to be variable as a function of the control signal. Automatic scanning of the oscillation frequency of the output from the said voltage controlled oscillator is effected by varying the said control signal and thus the frequency division rate of the programmable frequency divider. Therefore, if such a voltage controlled oscillator is used as a local oscillator of a tuner of a radio receiver, automatic scanning of the receiving band can be effected by varying the frequency division rate of the programmable frequency divider, as described above. If and when the frequency of a broadcasting station is tuned by the tuner, a reception output is obtained by the receiver, which is utilized to disable variation of the said control signal, thereby to establish a reception state of the receiver.

The variable range of the frequency division rate of the programmable frequency divider should be determined depending on the range of the local oscillation frequency of the local oscillator for a given receiving band, such as an AM medium wave band, AM short wave band, FM band, or the like and the frequency difference between the adjacent two broadcasting station frequencies, such that the receiver can receive any broadcasting frequency of the said given receiving band. Thus, it is appreciated that the variable range of the frequency division rate of the programmable frequency divider should be different depending on the receiving band. For example, the Japanese standard for FM broadcasting has been determined as the range of receiving frequencies being 76 through 90 MHz, the intermediate frequency being 10.7 MHz and an interstation frequency being 100 KHz, which means that the local oscillation frequency should be varied 65.3 through 79.3 MHz. Accordingly, it is necessary that the frequency division rate of the programmable frequency divider is varied from 653 to 793. On the other hand, the Japanese standard for AM medium wave broadcasting has been determined as the range of receiving frequencies being 535 through 1605 KHz, the intermediate frequency being 455 KHz and the interstation frequency being 10 KHz, which means the local oscillation frequency should be varied from 990 to 2060 KHz and accordingly the frequency division rate of the programmable frequency divider need be varied from 99 to 206.

If a radio receiver employing a frequency synthesizer including a phase locked loop as discussed in the foregoing is adapted to be easy of precise setting of a receiving frequency and is provided with a display capable of displaying a digital representation of the receiving frequency, it would be more advantageous. If such a radio receiver is adapted to provide various performance such as display of the time and the like, it would be much more desirable. However, such provision in a radio receiver employing a frequency synthesizer is of a receiver concept totally different from that of the prior art and therefore this fact makes the circuit configuration and the operation thereof complicated and particularly makes difficult the control of the circuit for the purpose of the scanning operation of a receiving band. For example, it is extremely difficult to coordinate the controls in selection of automatic scanning and manual scanning, automatic start of scanning in response to band switching, presetting of tuning frequencies in the course of scanning operation, and the like in such a radio receiver employing a frequency synthesizer.

SUMMARY OF THE INVENTION

Briefly stated, the present invention comprises a superheterodyne receiver, comprising means for receiving a high frequency signal, local oscillating means for providing an oscillation frequency signal the frequency of which is different by a given frequency difference from said received high frequency signal, and mixing means responsive to said received high frequency signal and said local oscillation frequency signal for providing an intermediate frequency signal; said local oscillating means comprising voltage controlled oscillating means for providing an oscillation frequency signal the oscillation frequency of which is variable as a function of a given control voltage, means for modifying the oscillation frequency of the output from said voltage controlled oscillating means, means for controlling the rate of frequency modification of said oscillation frequency modifying means, and means responsive to the output from said oscillation frequency modifying means, as modified at the frequency modification rate controlled by said frequency modification rate controlling means, for providing a control voltage associated with the frequency of the output from said oscillation frequency modifying means to said voltage controlled oscillating means, whereby said local oscillating means is adapted to provide a local oscillation frequency signal the frequency of which is associated with the frequency modification rate, as controlled by said frequency modification rate controlling means, said receiver further comprising means for inputting information concerning the manner of controlling said frequency modification rate by said frequency modification rate controlling means, and means responsive to said information inputted by said inputting means for sequentially controlling the manner of control of said inputting means for sequentially controlling the manner of control of said frequency modification rate by said frequency modification rate controlling means.

In a preferred embodiment of the present invention, the said sequence control means comprises means for generating timing signals and means responsive to the said information inputted by said inputting means for generating a sequence control signal in synchronism with the said timing signals obtainable from said timing signal generating means.

Therefore, a principal object of the present invention is to provide an improved digital frequency synthesizer receiver employing a phase locked loop, wherein the scanning operation is effected through a sequential control of the phase locked loop as a function of a timing signal.

Another object of the present invention is to provide an improved digital frequency synthesizer receiver, wherein the scanning operation is made of the corresponding receiving band starting from the minimum or maximum frequency in response to a band switching function.

A further object of the present invention is to provide an improved digital frequency synthesizer receiver, wherein a control for scanning operation of the receiver is structured such that it is responsive to depression of various inutting switches for achieving a sequential control of the receiver for performing various operation modes, such as a scanning mode, a band selecting mode, a presetting mode and the like.

These objects and other objects, features, aspects and advantages of the present invention will become more apparent from the following more detailed description of the present invention when taken in conjunction with the accompanying drawings.

DESCRIPTION OF THE PREFERRED EMBODIMENTS

Figure 1:
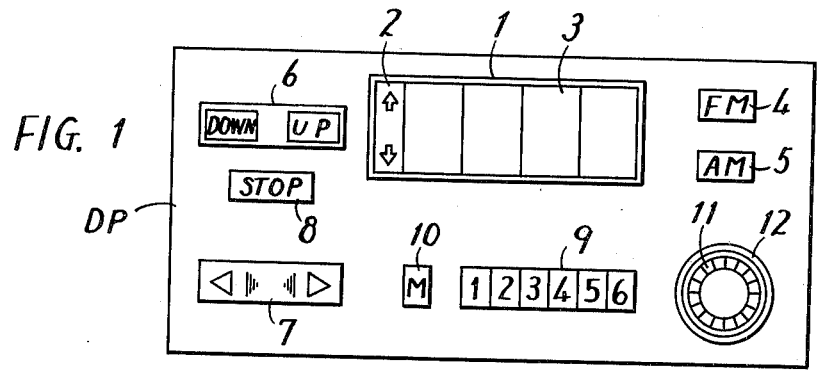
FIG. 1 is a front view of an operation/display panel of a radio receiver of a digital display type in accordance with an embodiment of the present invention.

FIG. 1 is a front view of an operation/display panel of a radio receiver of a digital display type in accordance with an embodiment of the present invention. Referring to FIG. 1, the operation/display panel DP comprises a display 1, an FM band selecting switch 4 and an AM band selecting switch 5. The said display 1 comprises a scanning direction indicator 2 for indicating the direction of upward or downward scanning of the receiving band by selectively lighting the upward or downward arrow and a numerical display 3 capable of displaying the frequency of a broadcasting signal being received in terms of a four-digit numerical value. For example, according to the Japanese broadcasting standard, the frequency range of the FM preferably broadcast is 76.0 – 90.0 MHz and the frequency range of the AM broadcasting is 535 – 1605 KHz, which means that the digital representation of the frequency in the FM band should include a three-digit numerical value and the digital representation of the frequency in the AM band should include a four-digit numerical value. The FM band selecting switch 4 and the AM band selecting switch 5 are structured such that depression thereof makes band switching to the FM band from the AM band and from the FM band to the AM band, respectively, while a corresponding lamp provided internally of the corresponding switch is energized to emit light to display the depressed switch. The receiver is structured such that scanning of the receiving band is automatically started from the minimum frequency of the selected receiving band in response to the band switching, the selected receiving band being indicated by light emission of the lamp provided internally of the corresponding band selecting switch. For example, if and when the FM selecting switch 4 is depressed while the receiver is receiving the AM receiving band, the lamp within the FM selecting switch 4 is lit and the numerical display 3 makes display of the value, "76.0" (the minimum frequency of the FM band), while an upward arrow of the display 2 is also lit to make display of the upward scanning direction, whereupon scanning is made of the receiving band in the upward direction or in the direction toward a higher frequency.

The said operation/display panel DP is also provided with an automatic scanning switch 6 and a manual scanning switch 7 for the purpose of starting the scanning operation of the receiving band by the receiver. The automatic scanning switch 6 is structured such that, similarly to the scanning in response to the band switching, depression of the switch 6 enables an automatic scanning until a broadcasting station is selected as a result of scanning, when the automatic scanning is temporarily stopped, say for five seconds. If and when a scanning stop switch 8 is depressed during the temporal stoppage period of five seconds, a further scanning operation is discontinued, whereby the reception state of the said broadcasting station is established. On the contrary, if the switch 8 is not depressed during that period of time of five seconds, the automatic scanning is regained after the lapse of the said time period of five seconds, so that the next broadcasting station is selected. The said automatic scanning switch 6 comprises an upward scanning switch for automatic scanning in the direction toward a higher frequency and a downward scanning switch for automatic scanning in the direction toward a lower frequency. Thus, the direction of the scanning is determined depending upon the selection of either the upward or downward scanning switch. The receiver is structured such that the direction of the scanning is automatically reversed if and when the upper or lower limit of the frequency range in a given frequency band is reached as a result of automatic scanning. The manual scanning switch 7 preferably comprises a rocker type switch, which is structured such that depression of the left or right side, marked with an arrow, of the switch starts the scanning operation and the release of the depression discontinues the scanning. The direction of the scanning is determined such that depression of the right side causes the scanning operation in the direction toward a higher frequency and depression of the left side causes the scanning operation in the direction toward a lower frequency.

The said operation/display panel DP is further provided with a preset switch 9 and a memory switch 10 required for presetting. The preset switch 9 comprises six switches, 1 through 6, so as to enable selection of the six preset broadcasting stations, in the embodiment shown, each of which switches is provided with a lamp inside of the respective switch, such that it may be lit upon depression of the respective switch. If and when the memory switch 10 is depressed so that the internal lamp is lit while a given broadcasting station frequency is selected by the receiver and thereupon the preset switch 9 is depressed, the said selected frequency is preset in the circuit of the receiver, so as to be more fully described subsequently. If the memory switch 10 is once depressed, the internal lamp is kept lit, thereby to indicate that the presetting of a given frequency is possible during the time when the lamp within the memory switch 10 is lit. Usually, the memory switch 10 is first depressed, whereby the receiver is rendered in a state capable of presetting a given frequency, and a plurality of desired station frequencies are preset in turn in the receiver by depression of the preset switch 9 and selection of the broadcasting station frequencies as a result of scanning. If desired, some frequencies of another receiving band can also be preset by switching to the said other receiving band. After the presetting operation is completed, the memory switch 10 is again depressed, whereby it is returned to the original position and accordingly the internal lamp is deenergized, with the result that the receiver is brought in a state incapable of being preset. If and when a given preset switch 9 is depressed in such a state incapable of presetting, the corresponding internal lamp is lit and the corresponding station frequency among those frequencies preset as described above is immediately selected by the receiver.

The said operation/display panel DP is further provided with a power switch/volume control 11 and a tone control 12, for allowing an on/off control of the power supply and adjustment of the tone volume and quality.

It is pointed out that the said FM band selecting switch 4, AM band selecting switch 5, memory switch 10 and preset switch 9 each are of an automatic return type push button switch provided with an internal lamp therein, although the memory switch 10 may be a push switch and the FM band selecting switch 4 and an AM band selecting switch 5 each may be a switch of a type in which depression of one side makes the other side released alternately, whereby the said depression display by the internal lamp may be dispensed with. Alternatively, a display such as a light emitting diode or the like may be provided near the preset switch 9, whereby such an internal lamp may be dispensed with.

Figure 2:
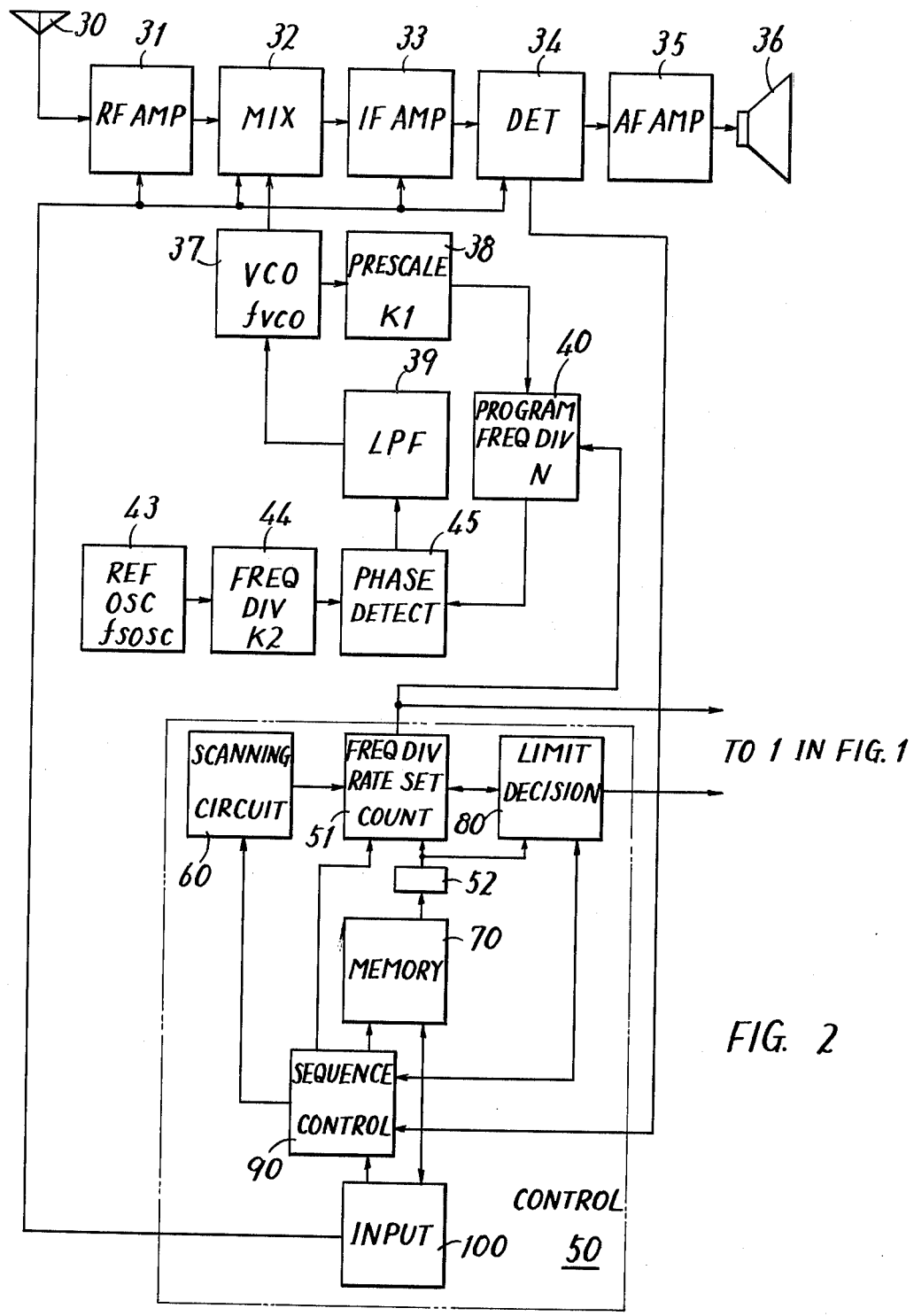
FIG. 2 is a block diagram of a radio receiver employing a typical digital frequency synthesizer employing a phase locked loop in accordance with an embodiment of the present invention.

FIG. 2 is a block diagram of a radio receiver employing a typical digital frequency synthesizer employing a phase locked loop in accordance with an embodiment of the present invention. The receiver shown comprises an antenna 30 for receiving a broadcasting wave, a radio frequency amplifier 31 for amplifying the received broadcasting wave, a mixer 32 for mixing the radio frequency output from the amplifier 31 with a local oscillation frequency output to be described subsequently for providing an intermediate frequency output, an intermediate frequency amplifier 33 for amplifying the intermediate frequency output from the mixer 32, a detector 34 for detecting the intermediate frequency output from the amplifier 33 for providing an audio frequency output, an audio frequency amplifier 35 for amplifying the audio frequency output from the detector 34, and a loud speaker 36 for transducing the audio frequency output from the amplifier 35 into a sound output. The mixer 32 is connected to receive a local frequency output from a voltage controlled oscillator 37 which serves as a local oscillator. The voltage controlled oscillator 37 is structured such that the oscillation frequency thereof is varied as a function of a control voltage applied thereto. In the receiver shown, such a control voltage is provided as an output from a phase detector 45, as filtered by means of a low pass filter 39. The phase detector 45 is connected to receive, at one input thereto, an output from a frequency divider 44, which is connected to receive an output from a reference oscillator 43. The phase detector 45 is also connected to receive, at the other input thereto, an output from a programmable frequency divider 40, which typically comprises a programmable counter. The programmable frequency divider 40 is connected to receive a pulse output from a prescaler 38 for the purpose of counting the number of pulses at the programmed rate and is also connected to receive a control signal from a control 50 for the purpose of controlling the said programmed rate. The prescaler 38 comprises a frequency divider for frequency dividing the output from the voltage control oscillator 37. The control 50 comprises a frequency division rate setting counter 51 for providing a set control signal to the programmable frequency divider 40 for setting the rate of counting by the counter 40 and a scanning circuit 60 for providing pulses to the setting counter 51.

As will become apparent when the description proceeds, the control 50 constitutes an essential portion of the present invention. It would be appropriate, therefore, to describe generally the operation of a digital frequency synthesizer receiver employing a phase locked loop, as shown in FIG. 2, before a more detailed description will be made of the control 50, for the purpose of providing the background information concerning such a receiver for facility of understanding of the present invention.

For the purpose of describing the operation of the FIG. 2 receiver, it is assumed that the oscillation frequency of the reference oscillator 43 is fsosc, the oscillation frequency of the voltage controlled oscillator 37 is fvco, the rate of frequency division by the prescaler 38 is 1/K1, the rate of frequency division by the frequency divider 44 is 1/K2, and the rate of frequency division by the programmable frequency divider 40 is 1/N. Then the following equation is obtained.

$$fsosc \cdot (1/K) = (1/N) \cdot (1/K1) \cdot fvco \qquad (1)$$

In general, in this type of frequency synthesizer, the relation K1 = K2 is adopted. Therefore, the equation (1) may be expressed as follows.

$$fsosc = fvco \cdot (1/N) \qquad (2)$$

Accordingly, the following equation is obtained.

$$fvco = N \cdot fsosc \qquad (3)$$

where N is an integral number.

By way of an example, assuming that fsosc = 100 KHz and N = 718, then fvco = 71.8 MHz is obtained from the equation (3). Therefore, further assuming that a receiving frequency fs is 82.5 MHz, these frequencies are applied to the mixer 32, whereby an intermediate frequency of 10.7 MHz is obtained, if and when a lower sideband superheterodyne is adopted, with the result that an FM broadcasting wave of 82.5 MHz can be received. Thus, variation of frequency division rate N of the programmable frequency divider on a one-by-one basis from 653 to 793 enables reception of the frequencies of the stations at the interval of 100 KHz from 76.0 MHz to 90.0 MHz.

Various data concerning receiption of the FM broadcasting wave in accordance with the Japanese standard are listed in the following.

Range of FM frequencies — 76.0 MHz ~ 90.0 MHz
Intermediate frequencies — 10.7 MHz 10.7 MHz
Range of oscillation frequency — 65.3 MHz ~ 79.3 MHz
Output from prescaler
(1/100 FREQ ~ DIV) — 653 KHz ~ 793 KHz
Range of setting counter 51 — 653 ~ 793 where a lower sideband superheterodyne is adopted and the reference frequency is 1 KHz, with the result that each count by the setting counter 51 corresponds to the inter-station frequency of 100 KHz.

Similarly, the data concerning reception of an AM broadcasting wave in accordance with the Japanese standard are listed in the following.

Range of AM frequencies 535 KHz ~ 1605 KHz
Intermediate frequency 455 KHz 455 KHz
Range of local oscillation frequency 990 KHz ~ 2060 KHz
Range of the counts by the setting counter 51 990 ~ 2060 where an upper sideband superheterodyne is adopted, the reference frequency is 1 KHz and the inter-station frequency is 10 KHz.

As seen from the equation (3), the oscillation frequency fvco of the voltage controlled oscillator 37, i.e. the local oscillation frequency, is the integral number N times the reference oscillation frequency fsosc of the reference oscillator 43, which usually comprises a crystal oscillator. Thus, it is appreciated that the frequency synthesizer of this type can be controlled in accordance with the stability and the precision of the oscillation frequency of a crystal oscillator and a radio receiver of high stability and precision of the local oscillation frequency can be provided.

As described previously, the present invention is directed to an improvement in the control 50. In accordance with the present invention, the control 50 is structured such that it is responsive to depression of various inputting switches in the operation/display panel in FIG. 1 for achieving a sequence control of the receiver for performing various operation modes, such as (1) SCANNING MODE, (2) BAND SELECTING MODE, (3) PRESET MODE, and the like. The control 50 comprises a frequency division rate setting counter 51 for providing the frequency division rate to the programmable frequency divider 40, a scanning circuit 60 comprising a pulse source for providing scanning pulses to the set counter 51, a limit decision circuit 80 for determining whether the count value in the set counter 51 has reached the value corresponding to the upper or lower limit of the predetermined frequency range of a given frequency band, a memory 70 for storing the frequency information to be initially loaded to the set counter 51 as an initial value, a sequence control 90 for controlling the circuits 51, 60, 70 and 80 in a suitable desired sequence, and an input circuit 100 for providing various signals to the sequence control 90 and the memory 70 in association with depression of the respective switches shown in FIG. 1. More specifically, the count value in the said set counter 51 is fed to the frequency divider 40 each time the programmable frequency divider 40 completes one cycle of frequency division at a given frequency division rate, because the frequency division rate of the frequency divider 40 is rendered in a clear state for each cycle of the frequency division. Therefore, it is appreciated that the tuning frequency by the receiver is determined as a function of the count value in the counter 51. During the scanning operation, the count value in the counter 51 is varied by the scanning pulses applied from the scanning circuit 60. For example, in case of the scanning operation of FM band, the scanning pulses are adapted to be applied one by one, whereby the tuning frequency by the receiver is varied at intervals of 100 KHz, while in case of the scanning operation of AM band, the scanning pulses are applied ten by ten, whereby the tuning frequency by the receiver is varied at intervals of 10 KHz. On the other hand, in case of the preset mode, the count value in the counter 51 may be varied such that the frequency information normally stored in advance in the memory 70 is applied through a gate 52 to the counter 51.

The decision circuit 80 is used to judge whether the count value in the counter 51 has reached or not the upper or lower limit count value corresponding to the upper or lower limit frequency in the receiving band during the scanning operation mode. For example, in case of the FM band, the range of the count value thereof is 653–793. Therefore, if the scanning operation is made in the direction toward a higher frequency, addition is made of one for each of the scanning pulses in the counter 51 until the count value reaches the upper limit of 793, when the scanning is reversed and subtraction is made of one for each of the scanning pulses, thereby to achieve the scanning in the direction toward a lower frequency, until the count value reaches the lower limit of 653, when the scanning is reversed as described above. In other words, the decision circuit 80 is aimed to define these upper and lower limits and is controlled in a sequential manner, together with the said scanning circuit 60, by means of the sequence control 90, whereby the desired scanning operation is achieved.

The said sequence control 90 is responsive to the signals from the input circuit 100 to control the said memory 70, thereby to load the new count value in the counter 51 via the gate 52 to the new value instantaneously. The input circuit 100 comprises the FM band selecting switch 4, the AM band selecting switch 5, the automatic scanning switch 6, the manual scanning switch 7, the scanning stop switch 8, the preset switch 9 and the memory switch 10, as shown in FIG. 1, for the purpose of supplying the information concerning the control of the counter 51 to the said memory 70 and the sequence control 90.

The band switching output from the said input circuit 100 is applied to the radio frequency amplifier 31, the mixer 32, the intermediate frequency amplifier 30 and the detecting circuit 34, whereby the circuits concerned are made to be adapted to correspond with the FM or AM band. The received signal obtainable from the detector 34 is applied to the sequence control 90 for the purpose of control of the sequence control. The outputs from the said counter 51 and the decision circuit 80 are also applied to the display 1 in FIG. 1, thereby to make a display of the scanning direction and the tuning frequency.

Figure 3B:
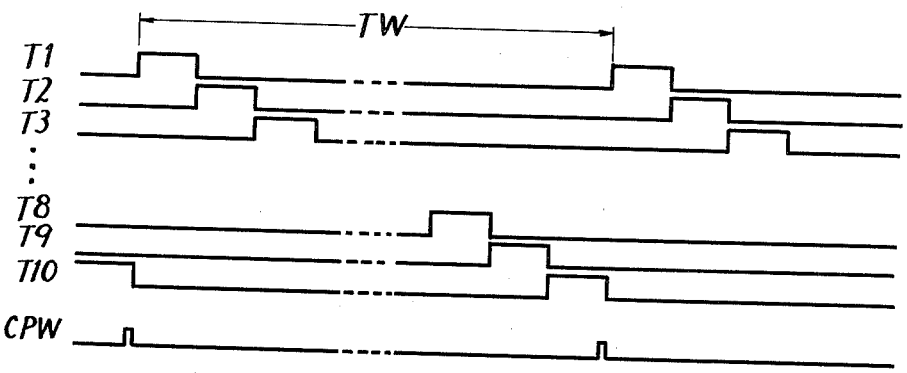
FIG. 3B shows wave forms of the timing signals generated by the timing signal generator 91 of FIG. 3.
Figure 3:
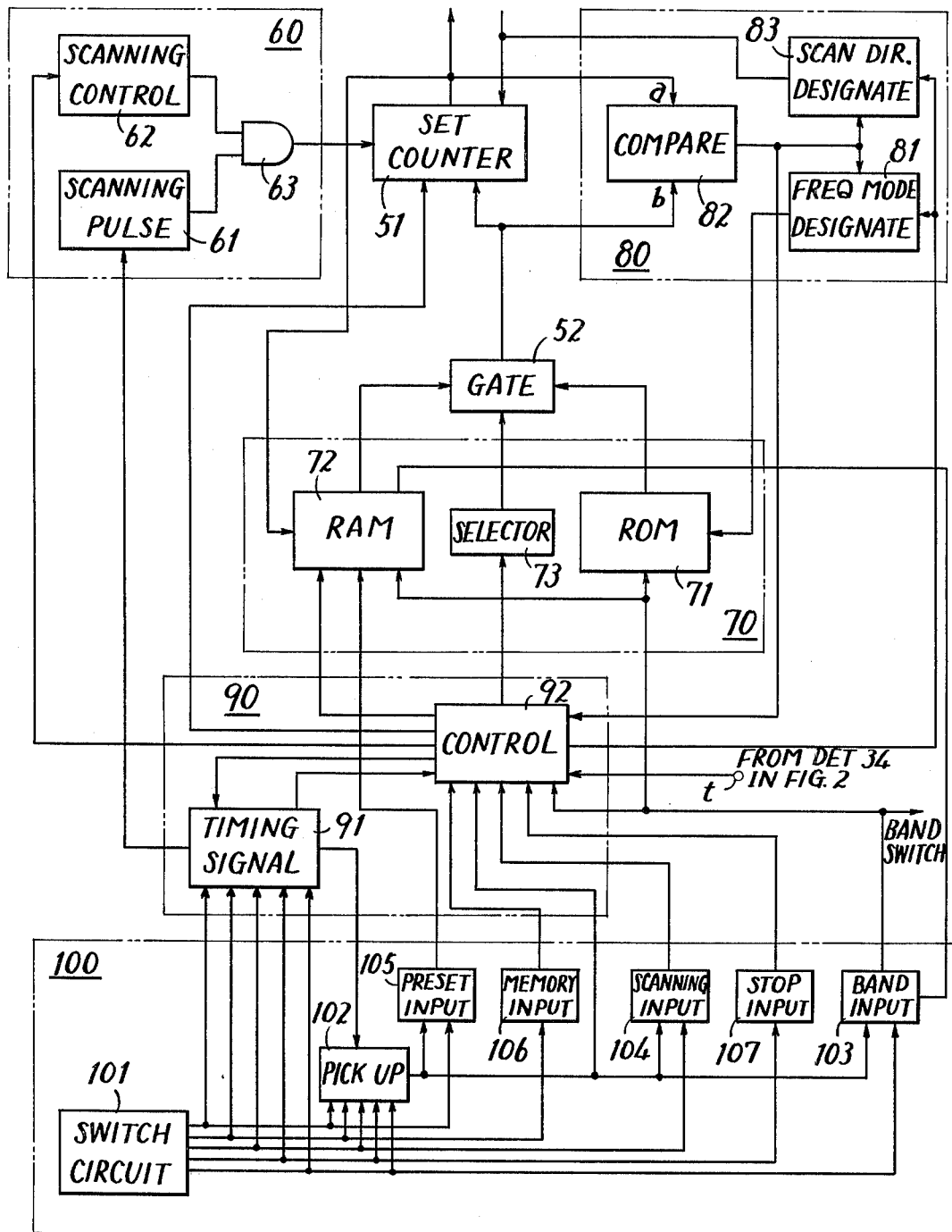
FIG. 3 is a block diagram showing in more detail only the counter control 50 of FIG. 2.

FIG. 3 is a block diagram showing in more detail only the counter control 50 of FIG. 2. The input circuit 100 comprises a switch circuit 101 for withdrawing the depression signals from the FM band selecting switch 4, the AM band selecting switch 5, the automatic scanning switch 6, the manual scanning switch 7, the scanning stop switch 8, the preset switch 9 and the memory switch 10, shown in FIG. 1, a pick up circuit 102 responsive to the output from the said switch circuit 101 for providing a pick up signal, and a band input storage 103, scanning input storage 104, preset input storage 105, memory input storage 106 and stop input storage 107, each responsive to the pick up signal from the pick up circuit 102 for tentatively storing the corresponding switch signals from the said switch circuit 101.

The said preset input storage 105 comprises a plurality of storage locations corresponding to the number of preset switches 9 i.e. six preset switches shown in FIG. 1, each of which is adapted to store the switch signal of the respective preset switch. It is pointed out that for simplicity of illustration only a single signal line is shown connected to the preset input storage 105 so as to generally represent six signal lines corresponding to six storage locations in the preset input storage 105. The information stored in the preset input storage 105 is transferred to a random access memory 72 of the memory 70 to be described subsequently as an addressing signal therefor, as will become more apparent when the description further proceeds. The said band input storage 103 also comprises a plurality of storage locations corresponding to the number of receiving bands which can be received by the receiver. Similarly, the said scanning input storage 104 also comprises a plurality of storage locations for storing various information concerning the scanning operation, such as information concerning the upward scanning and the downward scanning, the information concerning the automatic scanning and the manual scanning, and the like.

A timing signal generator 91 included in the sequence control 90 is provided to be responsive to the output from the said switch circuit 101 to generate the timing signal to drive the control circuit 92 as well as the said pick up circuit 102 to generate the pick up signal. Each of the switch signals is stored in the corresponding input storage as a function of the pick up signal. The said timing signal is also applied to a scanning pulse source 61 of the scanning circuit 60, so that the pulse source 61 generates scanning pulses in synchronism with the said timing signal. The timing signal generator 91 is enabled or driven by the switch signal from the switch circuit 101 and is disabled or stopped as the switch signal is terminated and the control circuit 92 terminates the operation thereof.

The memory 70 comprises a read only memory 71, readable/writable random access memory 72, and a selector 73. The memory 70 is normally energized by a separate power source provided independently of the power switch 11 in FIG. 1. The said read only memory 71 has been loaded in advance in a non-volatile manner the upper and lower limit values in terms of the count values associated with the upper and lower limit frequencies of the respective FM and AM bands. Accordingly, the upper and lower limit frequency information stored in the read only memory 71 is not volatilized, even though power failure occurs. The upper and lower limit frequency information stored in the read only memory 71 is read out in response to the output from the band input storage 103 of the said input circuit 100 and the output from a frequency mode designating circuit 81, which will be described subsequently and included in the said decision circuit 80, and is applied to the counter 51 through the gate 52 as an initial count value. In the following, more detailed description will be made of the read only memory 71 with reference to FIG. 3A.

Figure 3A:
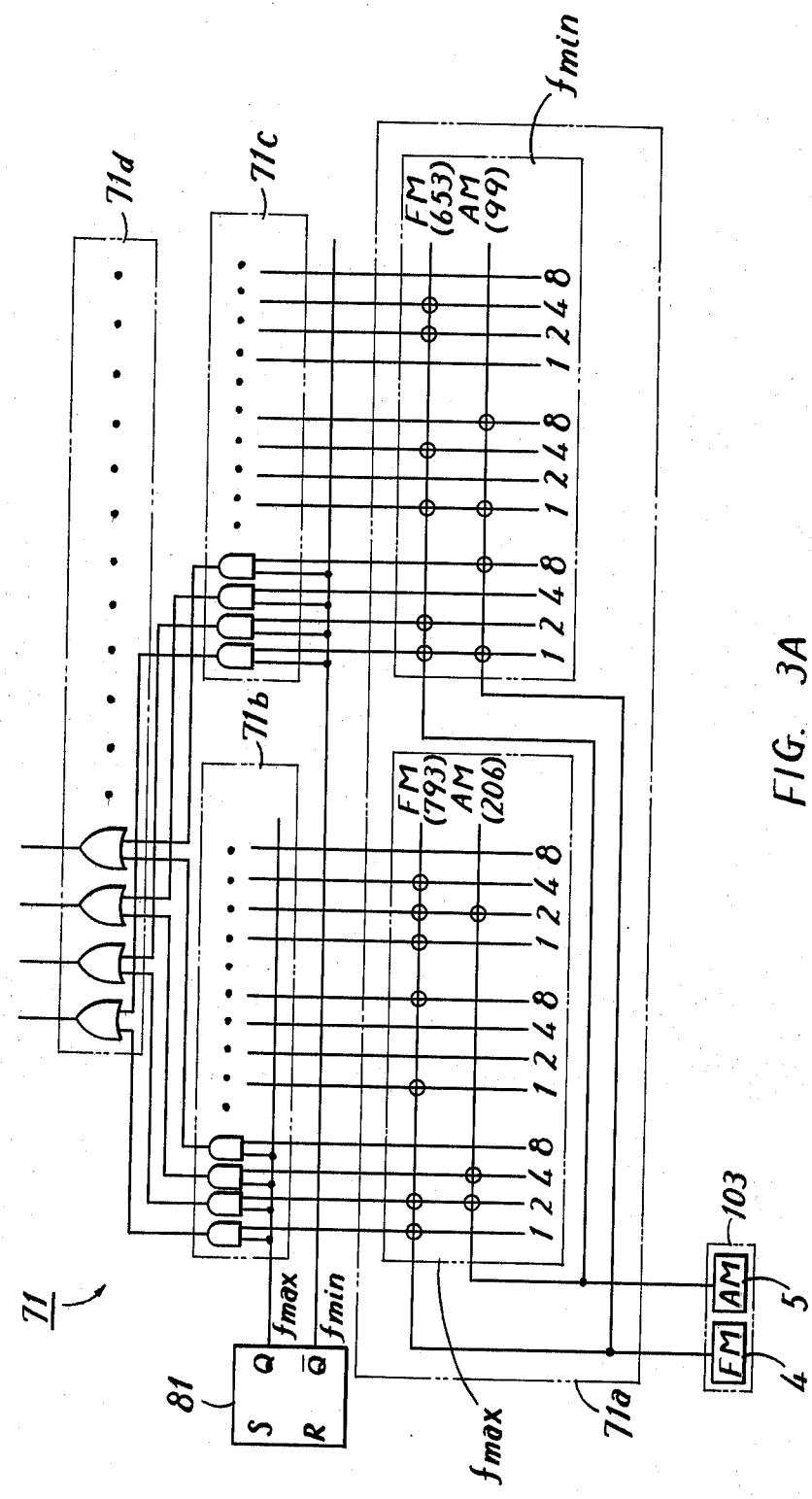
FIG. 3A is a more detailed block diagram of the read only memory 71 of FIG. 3.

FIG. 3A is a more detailed block diagram of the read only memory 71 in FIG. 3. The data concerning the maximum and minimum frequencies in each of the receiving bands each comprises, at the largest, a three-digit binary coded decimal value corresponding thereto. Thus, a memory region 71a in the read only memory 71 is shown comprising three sets of column signal lines in each of a maximum frequency region fmax and a minimum frequency region fmin, with each of sets of column line signals comprising four column signal lines corresponding to the bit positions of each digit. The maximum frequency region fmax comprises an FM selecting row line connected to th FM selecting switch 4 and an AM selecting row signal line connected to the AM selecting switch 5. Similarly, the minimum frequency region fmin comprises an FM selecting row signal line connected to the FM selecting switch 4 and an AM selecting row signal line connected to the AM selecting switch 5. With particular reference to the maximum frequency region fmax of the memory region 71a, only the intersections marked in circle between the column and row signal lines comprise interconnections for encoding the three-digit binary coded decimal value corresponding to the maximum frequencies in the respective receiving bands. More specifically, the said interconnections in marked in circle each comprise a diode connected from the row signal line to the column signal line with the polarity as depicted. As a result, if and when the FM selecting switch 4 is depressed, th FM selecting row signal line is brought to the high level and accordingly only the column signal lines with the said interconnections provided are brought to the high level, thereby to provide a three-digit binary coded decimal value corresponding to the maximum frequency in the FM band. Since the value corresponding to the maximum frequency in the AM band and the minimum frequencies in the FM and AM bands are also similarly obtained, a further description will be omitted. A gating circuit 71b in the read only memory 71 comprises three sets of AND gates, each set corresponding to the digit and comprising four bit AND gates, one of the inputs to these AND gates being connected to receive the set output from a flip-flop 81 constituting the said frequency mode designating circuit 81 in the limit decision circuit 80 and the other of the inputs to these AND gates being connected to receive the corresponding bit column signal lines in the maximum frequency region fmax of the memory region 71a. Similarly, a gating circuit 71c in the read only memory 71 comprises three sets of AND gates, each set corresponding to the digit and comprising four AND gates, one of the inputs to these AND gates being connected to receive the reset output from the flip-flop 81 and the other of the inputs to these AND gates being connected to the corresponding bit column signal lines in the minimum frequency region fmin of the memory region 71a. The outputs from the AND gates in the blocks 71b and 71c are connected through OR gates in the block 71d to the gate circuit 52 (not shown in FIG. 3A) in the parallel manner. Thus, it is appreciated that if and when the FM selecting switch 4 is depressed, the FM selecting row lines in the maximum frequency regions fmax and fmin are brought to the high level and accordingly the three-digit binary coded decimal values coded by the interconnections marked in circle corresponding to the maximum and minimum frequencies in the FM band are applied in the parallel manner to the AND gates in the gating circuits 71b and 71c. Therefore, if and when the flip-flop 81 is set, only the AND gates in the block 71b are enabled and accordingly only the three-digit binary coded value corresponding to the maximum frequency in the FM band is applied through the block 71d to the gate circuit 52. On the other hand, if and when the flip-flop 81 is reset, only the AND gates in the block 71c are enabled and accordingly only the three-digit binary coded decimal value corresponding to the minimum frequency in the FM band is applied through the OR gates in the block 71d to the gate circuit 52 in a parallel manner. If and when the AM selecting switch 5 is depressed, similarly only the three-digit binary coded decimal value corresponding to the maximum or minimum frequency in the AM band is selectively applied through the block 71d to the gate circuit 52 in a parallel manner depending on the storing state of the flip-flop 81.

The readable/writable random access memory 72 is used to achieve the preset mode and comprises memory regions for storing information in terms of the count value associated with the frequencies of the six broadcasting stations corresponding to the six preset switches 9 in FIG. 1 and for storing the information associated with the receiving bands to which the frequencies of the said broadcasting stations pertain. The random access memory 72 is structured to be responsive to the selective depression of the preset switches 9 to be operative to discriminate the writing mode and the reading mode depending on whether or not the memory switch 10 is depressed. More specifically, the preset mode comprises the writing mode for writing the information to be preset in advance in the random access memory 72 and the reading mode for reading the information already written in the random access memory 72 in the said writing mode for the purpose of using the same to select the corresponding broadcasting station.

During the writing mode, the random access memory 72 is adapted to write or store the information concerning the frequency received in the state of reception and the information concerning the band to which the said frequency pertains. For the purpose of achieving the writing mode, first the memory switch 10 and the preset switch 9 are depressed. Depression of the preset switch 9 causes the information concerning the depressed switch, i.e. the addressing information, to be applied to the corresponding storage location of the preset input storage 105, with the result that the addressing information corresponding to the depressed switch is applied from the present input storage 105 to the random access memory 72. On the other hand, depression of the memory switch 10 causes the depressed input to be applied through th memory input storage 106 to the control circuit 92, which accordingly applies a writing command to the random access memory 72. The random access memory 72 is responsive to the said writing company to write or store therein the information concerning the frequency being received stored in terms of the count value in the counter 51 and the information concerning the band of the said frequency obtainable from the band input storage 103. Thus, during the writing mode, the random access memory 72 is responsive to the depression of the preset switch 9 and the memory switch 10 to be loaded with the information concerning the frequency and the band thereof being received by the receiver.

On the other hand, during the reading mode, only the preset switch 9 is depressed. If and when only the preset switch 9 is depressed, i.e. if and when the memory switch 10 is not depressed and accordingly no output is obtained from the memory input storage 106, the frequency associated information in the address location of the random access memory 72 addressed by the preset input storage 105 is applied through the gate 52 to the counter 51, while the band associated information is applied to the bank input storage 103. As a result, the data in the counter 51 and the band input storage 103 are changed to the information concerning the desired broadcasting station.

The selector 73 is aimed to switch the gate 52 to apply the output from either the random access memory 72 or the read only memory 71 to the counter 51 or the decision circuit 80 and is usually implemented by a flip-flop such that it is responsive to the control signal from the control circuit 92 to switch the gate 52.

The said decision circuit 80 comprises a comparison circuit for detecting coincidence of the count value a in the counter 51 and the numeral value b obtainable from the gate 52, a circuit 83 for generating a signal designating the upward or downward scanning direction as a function of the output from the comparison circuit 82, and a circuit 81 for generating a signal designating the upper limit or lower limit frequency mode as a function of the output from the comparison circuit 82. The said decision circuit 80 is adapted to be enabled during the automatic and manual scanning operation. More specifically, depression of the scanning switch causes the corresponding control signal to be applied from the control circuit 92 to the signal generating circuits 81 and 83. In case of instruction of upward scanning, for example, the said signal generating circuit 81 is controlled to provide a signal designating the upper limit frequency mode, while the said signal generating circuit 83 is controlled to provide a signal designating the upward scanning direction. The upper limit frequency designating signal obtainable from the signal generating circuit 81 is applied to the read only memory 71. The read only memory 71 is responsive to the said upper limit frequency designating signal to be controlled to provide the information concerning the upper limit frequency of the corresponding receiving band. The upper limit frequency information thus obtained is applied through the gate 52 to the counter 51 and to the input b of the comparison circuit 82. On the other hand, the scanning direction designating signal obtainable from the signal generating circuit 83 is applied to the counter 51, whereby the counter 51 is rendered in an up count mode or is controlled to be operative as an up counter. If and when the count value in the counter 51 reaches the upper limit or lower limit value corresponding to the upper limit or lower limit frequency of the receiving band during the scanning operation, a coincidence output is obtained from the comparison circuit 82 and is applied to the said signal generating circuits 81 and 83. The signal generating circuit 81 is responsive to the coincidence output to provide a reading command to the read only memory 71 for reading out the information concerning the lower limit frequency of the receiving band, while the signal generating circuit 83 is responsive to the coincidence output to provide a down count mode command to the counter 51. Thus, the decision circuit 80 controls the counter 51 and the read only memory 71.

The scanning circuit 60 comprises a scanning pulse generator 61 responsive to the timing signal from the timing signal generator 91 included in the sequence control 90 for generating the scanning pulses, a scanning control circuit 62 responsive to the control signal from the control circuit 92 included in the sequence control 90 for generating a scanning control signal, and an AND gate 63 receiving the outputs from these circuits 61 and 62, whereby in case of the FM band the pulses are introduced to the counter 51 intermittently one by one and in case of the AM band the pulses are introduced to the counter 51 intermittently ten by ten, thereby to achieve the scanning operation in a different manner depending on the receiving band.

The said sequence control 90, which constitutes the major portion of the present invention, comprises the timing signal generator 91 implemented by a multiple number of flip-flops and the control circuit 92, to control in a sequential manner the said counter 51, the memory 70, the decision circuit 80 and the scanning circuit 60 in synchronism with the timing signal. For example, either automatic scanning or manual scanning is selected to achieve the scanning operation, the scanning is started from the lower limit frequency of the receiving band automatically in response to the band switching, a presetting operation is effected during the scanning operation and the like, thereby to perform a coordinated control of the system, as to be more fully described subsequently.

The said timing signal generator 91 is structured to generate the timing signals T1 through T10 as shown in FIG. 3B. The timing signals T1 through T10 are generated repeatedly with the interval TW as one cycle and generally the period TW is referred to as "one word period". The generator 91 is also structured to generate a clock signal CPW for each word period, i.e. a word clock pulse. Since this type of timing signal generator 91 is usually employed in a typical digital computer and is well known to those skilled in the art, a further description thereof will be omitted.

Figure 5:
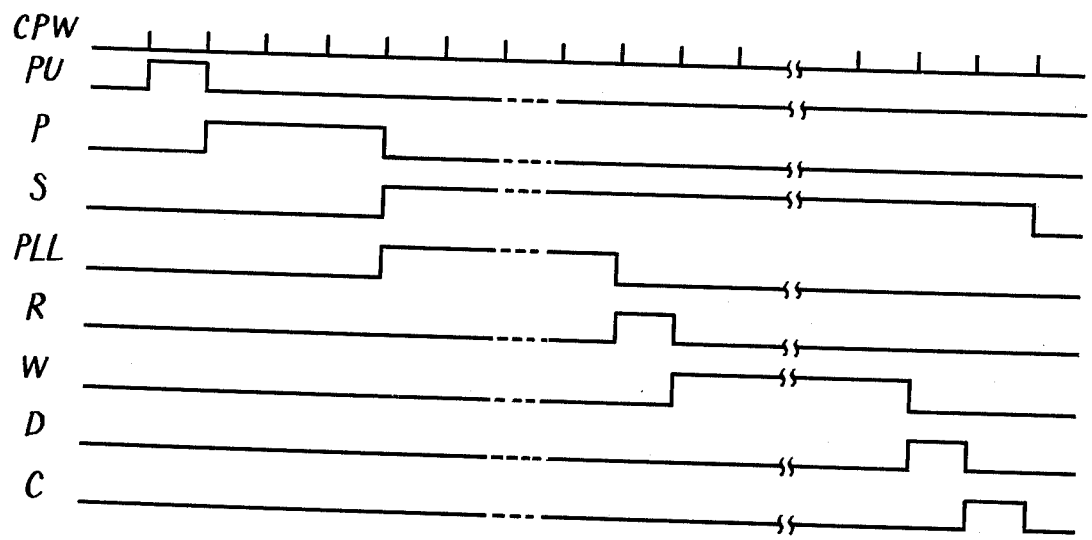
FIG. 5 is a graph of the sequence control period showing an example of the sequence control performed in accordance with the sequence diagram shown in FIG. 4.
Figure 4:
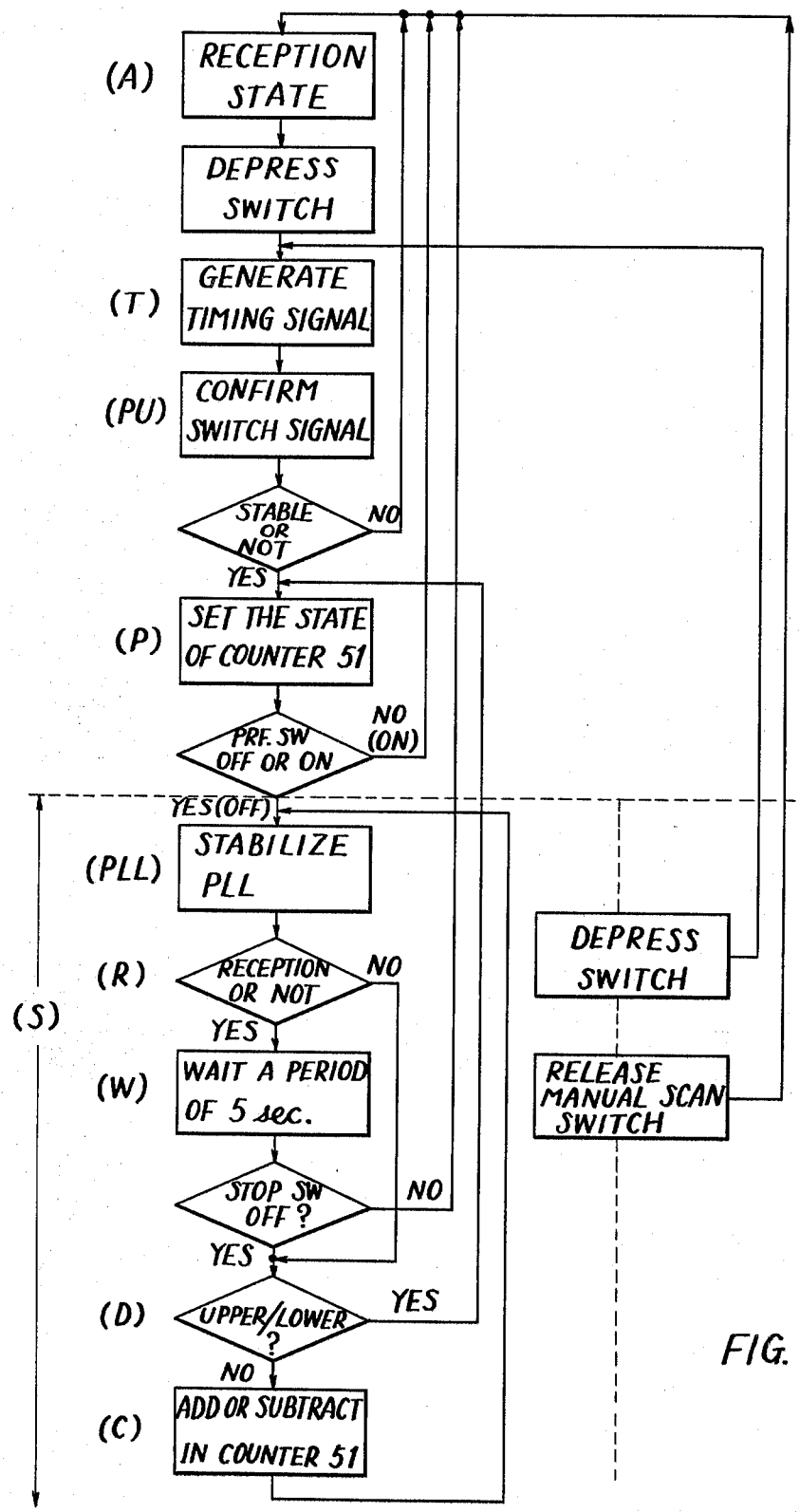
FIG. 4 shows the sequence diagram of a sequence control operation of various circuits included in the counter control 50 as a function of the control signals obtained from the control circuit 92 of FIG. 3.

FIG. 4 shows a sequence diagram of a sequence control operation of these circuits included in the counter control 50 as a function of the control signal from the control circuit 92 in FIG. 3. FIG. 5 is a graph showing a control period for each sequence control. Referring to FIGS. 4 and 5, sequence control operation of the control circuit 92 will be described. In FIG. 4, the characters A through C each show a state of sequence performed by a multiple number of flip-flops. The state A is a normal state for keeping a reception state of the receiver. In the state A, the timing signal generator 91 of the said sequence control 90 is disabled and thus no timing signal is generated, with the result that no sequential control is made to progress. If and when any one of the switches is depressed in the state A, the timing signal generator 91 is enabled in response to the output from the switch circuit 101 included in the input circuit 100 in FIG. 3 and the timing signals continue to be generated until the state A is regained. The timing signals are shown in FIG. 3B, as described previously. If and when the timing signals T1 through T10 and the word clock signal CPW are generated, the pick up circuit 102 included in the input circuit 100 in FIG. 3 is enabled to generate the pick up signal.

When the pick up signal is generated, the respective input storages are accordingly enabled, whereby the switch signals are stored in the corresponding input storage after the switch signals from the switch circuit 101 have been stabilized, i.e. the switches have been stably depressed. For example, if and when the FM band selecting switch 4 in FIG. 1 is depressed, the FM band selecting signal is stored in the band input storage 103. The FM band selecting signal as stored is applied to the control circuit 92 included in the sequence control 90 and the memory circuit 70. At the same time as the FM band selecting signal is stored, the AM band selecting signal so far stored is cleared. If and when depression of the switches is not correct, the pick up signal is not provided and accordingly the respective switch input storages are not enabled, whereby malfunction because of incorrect depression is prevented. The pick up signal thus generated further enables the control circuit 92 to initialize the sequential operation of the states P through C. The said control circuit 92 is implemented by a multiple number of flip-flops, as described previously, to sequentially perform the sequence of the states P through C in synchronism with the word clock pulse CPW. The graph of the sequence control period in FIG. 5 shows an example of such sequence control. Briefly stated, the state P of three-word period is followed by a long period state S for the scanning operation, during which period a state PLL of a relatively long period, a state R of one-word period, a state W of a relatively long period, a state D of one-word period and a state C of one-word period occur successively. The data concerning the operations in the respective states PLL, D and C are set in the counter 51 at the state P as shown in FIG. 4. The manner of setting the data in the counter 51 is different depending on the respective control modes. For example, in case of the preset mode, when the preset switch 9 is depressed, the information as preset is introduced from the random access memory 72 to the counter 51, while, in case of the band switching mode, when the band selecting switch 4 or 5 and the scanning switch 6 or 7 are depressed, the information concerning the upper or lower limit frequency of the corresponding receiving band is introduced from the read only memory 71 to the counter 51 in advance of the start of scanning operation. When the state P is terminated, the following step S is assumed to start the scanning operation, but in case of depression of the preset switch 9, no scanning operation is necessary and therefore the state A is regained without assuming the state S.

Now consider a case where the state S is assumed. In the state S, first the state PLL is started. In the state PLL, a time period of about 50 milliseconds is taken for the purpose of stabilization of the phase locked loop in FIG. 2, thereby to stabilize the operation of the circuit. In the state R assumed thereafter, determination is made of whether the broadcasting wave is received with frequency stability. If no broadcasting wave is received, the state D is assumed without assuming the following state W. If a broadcasting wave is received, a waiting period of five seconds is taken in the state W, so that the operator of the receiver can listen to the broadcasting during that period. If the broadcasting is that which the operator wishes to further listen to, the stop switch 8 is depressed, whereby the state S, i.e. the scanning operation, is immediately released to return to the state A. If the broadcasting is not that which the operator wishes to further listen to, the stop switch 8 is not depressed and therefore the following state D follows. In the state D, determination is made of whether the count value in the counter 51 has reached or not the data concerning the upper or lower limit frequency and if and when the upper or lower limit data has not been reached, the following state C is assumed, whereupon addition/subtraction is made in the counter 51 of one in case of the FM band and of ten in case of the AM band, thereby to achieve the scanning operation of the receiving band. If the upper or lower limit data is achieved, the scanning is terminated and the state S is released to return to the state P, whereupon the above described operation is performed again starting from the state P. If and when another switch is depressed in the state S, the state S is immediately released, whereby transition is made through the state T to the state PU. For example, if another scanning switch is depressed during the scanning operation and the band is switched, a new sequence is started.

Referring now to FIGS. 3 and 4, the operation of the system shown will be described more specifically. In advance of the description of the operation of the system, however, it would be appropriate to first describe some preconditions to be required to the radio receiver of the embodiment shown. If and when the power switch 11 in FIG. 1 is turned on, the state A in the sequence shown in FIG. 4 is assumed, thereby to establish a reception state of the receiver. However, if the count value in the counter 51 is volatilized when the power switch is turned off thereafter, then the counter 51 comes to be loaded with a data of a random nature when the power is turned on again. Similarly, if the data in the band input storage 103 in the input circuit 100 is volatilized when the power switch is turned off, then it would become uncertain which band should be selected when the power is turned on again. In order to avoid such a situation, the counter 51 and the band input storage 103 are adapted to be energized by a battery provided independently of the power switch 11, or alternatively the counter 51 and the storage 103 are implemented by a non-volatile memory, such that the data may be kept stored irrespective of turning on or off of the power supply. Therefore, even if other circuits are deenergized when the power supply is turned off, the counter 51 and the band input storage 103 keep storing the data until the power supply is turned on, whereby the same band and the frequency are designated and the same broadcasting station as that received before turning off of the power supply is received again.

Since the memory 70 in FIG. 3 is also energized by a separate power supply similarly to the case of the counter 51 and the band input storage 103, the read only memory 71 keeps storing the information concerning the upper and lower limit frequencies of the respective receiving bands, and the random access memory 72 keeps storing the frequency information and the band information of the six broadcasting stations, as preset, while the selector 73 keeps storing the information as to which output from the read only memory 71 or the random access memory 72 should be switched by means of the gate 52. For example, even in case where the output from the random access memory 72 has been withdrawn through the gate 52 to the counter 51 before the power supply is turned off, i.e. even if the preset count value has been read out by the preset input storage 105, the count value in the counter 51 is controlled as a function of the pulses from the scanning circuit 60 and the decision signal from the decision circuit 80, unless the write-in signal is obtained from the control circuit 92.

On the assumption as described in the foregoing, description will be made of the scanning mode, the band selecting mode and the presetting mode.

1. Scanning Mode
 1. Automatic Scanning Mode

Now consider a case where the upward scanning switch of the automatic scanning switch 6 is depressed while the FM band has been selected. The timing signal generator 91 is responsive to the depression of the scanning switch 6 to generate the timing signals, as in the state T in FIG. 4. If and when the said scanning switch 6 has been depressed properly, the pick up circuit 102 is responsive to the said timing signals to provide a pick up signal. The scanning input storage 104 is responsive to the pick up signal to be cleared of the stored data (in the foregoing description of the precondition, the storage 104 was described as not having stored a scanning command signal, since the preceeding state was the presetting mode), and instead the upward scanning command is stored. The control circuit 92 is enabled as a function of the said pick up signal, whereby the state P in FIG. 4 is assumed. In the state P, the control circuit 92 is responsive to the said upward scanning command from the scanning input storage 104 to provide the control signal to the decision circuit 80 and the selector 73. In the decision circuit 80, the scanning direction designating signal generator 83 is controlled as a function of the said control signal from the control circuit 92 to provide the upward direction designating signal, while the frequency mode designating signal generator 81 is controlled as a function of the said control signal from the control circuit 92 to provide the upward limit designating signal. On the other hand, the selector 73 is responsive to the said control signal from the control circuit 92 to be changed and the gate 52 is switched from the random access memory 72 to the read only memory 71. As a result, the upper limit frequency information of the FM band stored in the read only memory 71 is withdrawn through the gate 52 to the counter 51 in response to the outputs from the bank input storage 103 and the frequency mode designating signal generator 81. However, since the write-in control signal is not obtained from the control circuit 92 in this scanning mode, the upper limit frequency information of the FM band is not loaded in the counter 51 and accordingly the count value in the counter 51 is not changed and a previously loaded count value of the FM band is kept stored. On the other hand, the counter 51 is brought in the state of upward direction, i.e. controlled to be operative as an up counter, as a function of the upward direction designating signal from the scanning direction designating signal generator 83, and sequential addition operation is effected in response to the pulses from the scanning circuit 60.

Next the sequence turns to be the scanning state S and stabilization of the phase locked loop is achieved in the state PLL. Normally, the phase locked loop is stabilized within about ten milliseconds, but is preferably afforded 40 to 50 milliseconds for the purpose of full stabilization. Determination is made as to whether the broadcasting wave is received or not in the state R. If the broadcasting wave is received, the received signal obtainable from the detector 34 in FIG. 2 is supplied to the control circuit 92 through the input terminal $t$, whereby the control circuit 92 is rendered in the state W. If the received signal is not obtained, the state D is immediately assumed. In the state W, there is only a five-second waiting period, and if the stop switch 8 in FIG. 1 is depressed in that period of time, the state S is released to return to the state A. If the stop switch 8 is not depressed, determination is made in the following state D of whether the upper limit or lower limit value is reached. In this case, comparison is made in the compare circuit 82 of the decision circuit 80 of the count value a in a counter 51 as added and the information b associated with the upper limit frequency of the FM band introduced through the gate 52 from the read only memory 71. Since the condition $a = b$ is met when the upper limit value is reached, the state S is released in the control circuit 92, thereby to return to the state P again. In case where the upper limit value is not reached, the sequence is shifted to the state C, and the scanning control circuit 62 is driven as a function of the control signal from the control circuit 92 and the pulse from the scanning pulse generator 61 is introduced into the counter 51 through the AND gate 63, with the result that one is added to the count value in the counter 51. After the state C, the state PLL is regained, and thus the states PLL through C are repeated. If and when the condition $a=b$ is met in the compare circuit 82 in a given cycle, i.e. the count value in the counter 51 becomes the upper limit value, the state S is released to return to the state P.

In case where the abovementioned upper limit value is reached, the state P is regained and, even if the information stored in the scanning input storage 104 as a function of the control signal from the control circuit 92 is of the upward direction, the condition $a=b$ is adapted to have preference and the scanning direction designating signal generator 83 in the decision circuit 80 is rendered in the downward direction. Accordingly, the counter 51 is brought in the subtraction operation or controlled to be operative as a down counter, while the frequency mode designating signal generator 81 is switched to the lower limit mode, whereby the information concerning the lower limit frequency in the FM band stored in the read only memory 71 is withdrawn. Thereafter, the scanning operation in the downward direction in the state S is started again and the operation as described in the foregoing is effected until the count value in the counter 51 reaches the lower limit value.

If and when the downward direction scanning switch 6 is depressed during the scanning operation in the upward direction, the state S is immediately released and the sequential operation is performed again from the state P after the states T and PU are assumed. Transition to the upward scanning in the course of the downward scanning is similarly effected.

2. Manual Scanning Mode

In case where the manual scanning is to be effected, the arrow mark of either the left or the right of the manual scanning switch 7 is depressed, thereby to start the scanning in the manner similar to the above described automatic scanning. A different point is that when the depression of the manual scanning switch 7 is released the release signal is applied from the scanning input storage 104 of the input circuit 100 to the control circuit 92, and the state S is released when the release signal is obtained, thereby to assume the state A, while the count value in the counter 51 at the time of release of the depression is kept. In other words, this corresponds to a case where the state S is released upon depression of the stop switch 8 at the time of the automatic scanning operation. Although the state PLL has been selected to be 40 through 50 milliseconds in case of the above described automatic scanning, the state PLL is selected to be longer in case of the manual scanning, say 500 milliseconds to one second, such that the operator can discern the broadcasting contents to allow for selection of a desired broadcasting station. Although the manual scanning is effected in the upward direction as described in the foregoing, the manual scanning in the downward direction is also similarly effected.

If and when the scanning switch 7 is depressed in the course of the said automatic scanning operation, the state S is accordingly released and a new sequence is started from the states T and PU, thereby to start the scanning operation in the desired direction.

2. Band Selecting Mode

Consider a case where the AM band is selected when a given broadcasting station in the FM band has been received in the state A. Depression of the AM band selecting switch 5 in FIG. 1 causes the input circuit 100 in FIG. 3 to be enabled and the AM band selecting command is newly stored in the band input storage 103 after the FM band selecting command stored in the storage 103 is cleared. The FM band selecting command from the storage 103 is applied to the read only memory 71 and the control circuit 92. The read only memory 71 is switched to the AM band in response to the said control signal. The control circuit 92 is responsive to the said command to provide a control signal to the decision circuit 80 and the selector 73. The scanning direction designating signal generator 83 in the decision circuit 80 is responsive to the said control signal from the control circuit 92 to be controlled to provide the downward direction selecting signal in the state P of the sequence, and the frequency mode designating signal generator 81 is responsive to the said control signal to be controlled to provide the lower limit frequency designating signal, whereby designation is made to read out information concerning the lower limit frequency in the AM band from the read only memory 71 and at the same time the gate 52 is switched by the selector 73 to the read only memory 71. Next, the write-in control signal is applied from the control circuit 92 to the counter 51 and accordingly the information concerning the lower limit frequency in the AM band in the read only memory 71 is instantaneously loaded in the counter 51. Thereafter, the scanning direction designating signal generator 83 is controlled again to provide the upward direction designating signal and the frequency mode designating signal generator 81 is switch to the upper limit frequency mode, whereby the information concerning the upper limit frequency of the AM band is withdrawn from the read only memory 71. Thus, the state S for the scanning operation is assumed, and the operation substantially the same as that in case of automatic scanning mode is performed after the state PLL. The same operation is also performed in case where the band is switched from the AM band to the FM band.

If and when the band switching is made in the course of the automatic scanning operation, the scanning is started from the minimum frequency automatically in accordance with a new sequence as in case of the start of a different scanning operation in the course of the scanning operation as described previously. Although in the foregoing the embodiment was described as starting the scanning in the upward direction from the minimum frequency in the selected band at the time of band switching, alternatively the scanning may be adapted to be made in the downward direction from the maximum frequency in the selected band.

3. Presetting Mode
1. Writing Operation

In the writing operation of the preset mode, the information concerning the frequency of the broadcasting station as selected as a result of the above described automatic or manual scanning is written or loaded in the random access memory 72. This will be described in more detail in the following. If and when the memory switch 10 in FIG. 1 is depressed while a broadcasting station is received in the state A, the store command is stored in the memory input storage 102 in the state PU and the state A is regained through the state P. If the preset switch 9 is depressed in this state, the write-in control signal from the control circuit 92 is applied to the random access memory 72 in the state P, and accordingly the count value in the counter 51 at the time is applied to the random access memory 72 and stored in the addressed location of the memory 72 corresponding to the depressed preset switch 9. If and when a different preset switch 9 is depressed after the scanning is effected and a different station is selected, the different count value in the counter 51 corresponding to the different station is stored in a different addressed location of the random access memory 72. Thus, the writing operation in the presetting mode is achieved. When the writing operation is over, the memory switch 10 is depressed, whereby the memory input storage 106 is cleared and accordingly the write-in signal applied from the control circuit 92 to the random access memory 72 is terminated.

2. Reading Operation

First the preset switch 9 in FIG. 1 is depressed and accordingly the state S is terminated, even in the course of the automatic scanning as in case of the foregoing example, and the states T and PU are assumed to return to the state P. In the state P the selector 73 is responsive to the control signal from the control circuit 92 to switch the gate 52 from the read only memory 71 to the random access memory 72, whereby the data stored in the random access memory 72 addressed by the present input storage 105 is introduced in the counter 51. Next the write-in control signal is applied from the control circuit 92 to the counter 51, whereby the count value in the counter 51 is instantaneously renewed to the information concerning the frequency obtainable from the random access memory 72. Immediately thereafter the state A is regained to terminate the operation.

Although the operation in various operation modes was described in the foregoing, it is appreciated that these modes are determined in response to the depression of the input switches and the sequence control of the determined mode is performed by means of the control circuit 92 in accordance with the sequence diagram in FIG. 4. Referring to FIG. 4, the sequence control is effected in accordance with the foregoing respective states P through C, and as a result, the inventive system achieves a coordinated overall control of the respective operations, such as the selected scanning of the automatic scanning or the manual scanning, automatic start of the scanning operation at the time of band switching, the presetting operation in the course of the scanning operation and the like.

Figure 6:
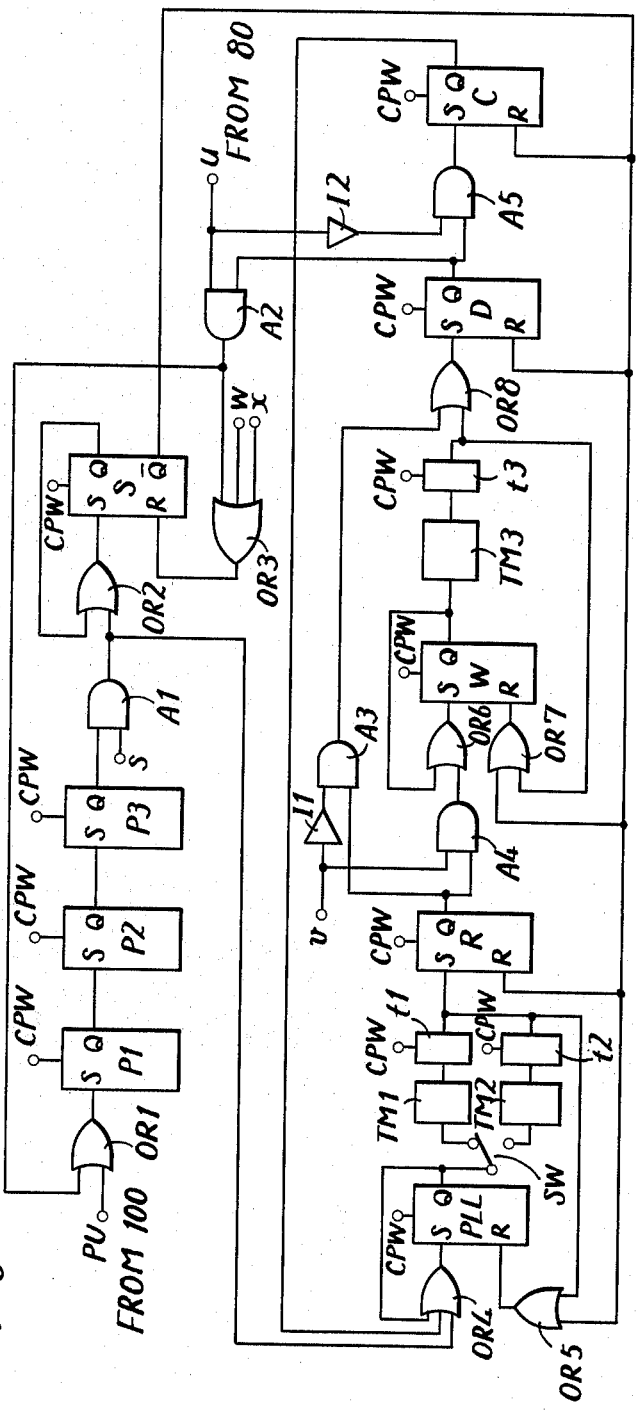
FIG. 6 is a portion of the circuit diagram of the control circuit 92 of FIG. 3.

FIG. 6 is a portion of the circuit diagram of the control circuit 92 in FIG. 3, which portion performs the sequence shown in FIG. 4. Referring to FIG. 6, the flip-flops P1, P2 and P3 are used to achieve the state P in the sequence in FIG. 4. Similarly, the flip-flop S is used to achieve the state S, the flip-flop PLL is used to achieve the state PLL, the flip-flop R is used to achieve the state R, the flip-flop W is used to achieve the state W, the flip-flop D is used to achieve the state D, and the flip-flop C is used to achieve the state C. These flip-flops are of a type in which resetting has preference to setting and the set output Q or the reset output Q is obtained upon receipt of the set of reset input in sychronism with the word clock pulse CPW. Among these flip-flops, OR gates OR1 through OR8, and gates A1 through A5, inverters I1 and I2, timer circuits TM1 through TM3 and synchronizing circuits t1 through t3 are suitably connected. The timer circuits TM1, TM2 and TM3 are used to delay the input signals for 40–50 milliseconds, 0.5–1 seconds and five seconds, respectively, and the delayed signals are again synchronized with the word clock pulse CPW in the synchronizing circuits t1, t2 and t3, respectively. Between the flip-flop PLL and the timer circuits TM1 and TM2 is provided a switch which is operable in response to the switching by a switch SW between the automatic scanning and the manual scanning of the operation panel in FIG. 1. The terminal u is connected to one input to the AND gate A2 is supplied with the determination output of the upper or lower limit of the frequency obtainable from the decision circuit 80. The terminal v connected to one input to the AND gate A4 and the inverter I1 is supplied with the signal indicating whether a broadcasting station is received or not obtainable from the detector 34 in FIG. 2. The terminal PU is supplied with the pick up signal. The flip-flops P1 through P3 are responsive to the pick up signal to provide a sequential signal in synchronism with the word clock pulse CPW, so as to form the signal in the three-word period in the state P in FIG. 5. The output from the flip-flop P3 is connected of one input to the AND gate A1. If and when the scanning signal is received through the terminal S, the output from the flip-flop P3 is applied to the set input of the flip-flop S through the AND gate A1 and the OR gate OR2. At the same time as the flip-flop S is set, the reset signal Q of the flip-flop S is terminated and the flip-flops PLL, R, W, D and C are not supplied with the reset signal, so that these flip-flops are rendered in the state capable of being set, and accordingly the flip-flop PLL is set by the set output from the flip-flop P3 obtainable through the AND gate A1 and OR gate OR4. The set output Q of the flip-flop PLL is transferred to the flip-flop R through the timer TM1 or TM2 and the synchronization circuit t1 or t2 as selected by the automatic/manual switch SW. The set output Q of the flip-flop R is applied to the flip-flop W or D depending on the presence or absence of the received signal at the terminal v. The set output Q of the flip-flop D is applied to the reset input of the flip-flop S and the set input of the flip-flop P1 in the presence of a determination signal of the upper limit or the lower limit frequency at the terminal u, and is transferred through the AND gate A5 to the set input of the flip-flop C in the absence of the determination signal. When the determination signal is applied to the flip-flop C, it is set and the set output Q of the flip-flop C is introduced to the flip-flop PLL, thereby to effect the same operation as described previously. On the other hand, when the determination signal is applied to the reset input of the flip-flop S and the set input of the flip-flop P1, the flip-flop S is reset and accordingly the respective flip-flops PLL, R, W, B and C are forcibly reset, while the flip-flop P1 is again set, whereby the same operation as described previously is effected by the flip-flop P1. When the release signal of the manual scanning switch or the switch signal of the band switching, preset, memory and auto scanning is introduced to the terminals w and x, then the flip-flop S is reset and accordingly the sequence control is terminated. If a signal other than a stop switch is received among switch signals, a pick up signal is again provided at the terminal PU and the sequence operation is again started by the flip-flop P1.

In the foregoing example, the timing signal is generated in response to the switch signal and is terminated when the sequence control is ended, but alternatively the timing signal may be generated at all times. Further, the present invention can be practiced with not only the AM and FM bands but also with any other bands. The present invention can also be practiced such that scanning is effected in only one direction, not to mention the scanning in both the upward and downward directions as described previously. Even in case where the intermediate frequency is changed in the Am band, the present invention can be practiced in the same manner as described previously by varying the said scanning pulses. Thus it is possible to make various modifications and changes in accordance with the principle of the present invention.

Although in the foregoing example, the state S is adapted to be released when the switch is depressed in the course of the scanning in the state S, the present invention can be practiced such that the operation is effected by depression of the switch without release of the state S in case of the depression of the switch which is not related with the scanning of the state S. For example, considering a case where the memory switch is depressed during the scanning operation, i.e. during the state S, the system may be structured such that depression of the memory switch during the scanning operation is not directly related with the scanning. In such an example, therefore, the sequence operation may be effected based on the depression of the memory switch in the parallel manner without necessity of releasing the state S. Accordingly, the sequence control may be implemented such that referring to FIG. 4 the state PU may be entered in response to depression of the memory switch without releasing the state S, whereupon the state T is assumed for setting the count value in the counter 51 and the sequence is terminated or is returned to the original for the first time after the state P is terminated. This approach eliminates loss of time that the memory switch is depressed during the state S whereupon the state S is released and thereafter the sequence is carried out in response to the depression of the memory switch. This parallel sequence operation is advantageous, because if the system is structured to be capable of displaying the time as well, switching between the time display and the frequency display can be effected even in the course of scanning in the state S, such that the time can be known by switching the display temporarily to the clock during the scanning operation. In such a case where the system has been adapted to be capable of displaying the time as well, switching of the display between the time and the frequency may be effected in association with turning on and off of the power supply of the radio receiver. For example, the system may be structured such that the display is switched to the time display if and when the power supply of the radio receiver is turned on. Alternatively, the system may be structured such that the display is switched automatically from the time display to the frequency display in response to the scanning operation of the receiver while switching of the display is not made during the time display mode and the time display is regained when the power supply of the receiver is turned off.

As described in the foregoing, accordng to the fundamental embodiment of the present invention, the basic advantage is brought that the sequential control of the present invention makes the scanning operation very simple. In addition, adoption of the sequence control enables a variety of switch operations and thus provides a multi-performance receiver with ease, inasmuch as the sequence control can achieve a jump or relay of the sequence in response to the input signals, as well known to those skilled in the art. On the basis of the above described fundamental feature and advantage of the present invention the following various specific advantages are brought.

Firstly, since selection of the broadcasting station is started after the phase locked loop has been stabilized and decision to select the broadcasting station is made during a prolonged waiting time period if and when such a broadcasting station capable of being received is found, stabilized selection of a broadcasting station can be made. Since in the sequence control portion for the purpose of the scanning operation mode determination as to the uper limit or the lower limit frequency is made and the addition or subtraction is made with respect to the count value in the counter based on the result of the said determination at the end of the sequence even if the frequency of a broadcasting station capable of being received is the upper limit or the lower limit frequency itself, the said broadcasting station can be selected. Since during the scanning operation the scanning pulses are obtained intermittently by repetition of the sequence as a function of the timing signals, correct scanning operation can be effected by the timing pulses.

Secondly, the coordinated overall advantages of the receiver as described in the following are brought. Since the timing signals are generated as a function of the switch signals or in response to depression of switches and generation of the timing signals are disabled by termination of the sequence and termination of the switch signals or release of depression of the switches, unnecessary circuits are not made operative during the state of reception and thus malfunction caused by noise can be prevented.

Thirdly, since the memory in the receiver is structured to be capable of keeping stored the information even when the power supply of the receiver is turned off, the information concerning the frequency of the broadcasting station when the power supply is turned off or the information as preset is kept stored, thereby to eliminate necessity of selecting the broadcasting station or presetting the information concerned each time the power supply is turned on.

Fourthly, the timing signals obtainable from the timing signal generator in the receiver may be applied to the display, as necessary, for the purpose of driving the display on a so called dynamic basis.

As the fifth feature, the inventive sequence control circuit and the peripheral circuits thereof as easy of implementation by way of a large scale integration (LSI) microcircuits and hence the receiver can be implemented in a small size.

In the embodiment described in the foregoing with reference to the FIGS. 1 through 6, a system was adapted such that scanning is made in the upward direction from the minimum frequency of the receiving band to reach the maximum frequency, when the scanning is automatically reversed to the downward direction toward the minimum frequency, i.e. the so called triangle shaped scanning is effected. In general, however, besides such triangle scanning, so called saw tooth shaped scanning is also known wherein the scanning is effected from the minimum frequency or the maximum frequency in the upward or downward direction to reach the maximum frequency or the minimum frequency, when the scanning is started from the minimum frequency or the maximum frequency again. The embodiment to be described in the following is aimed to change the manner of variation of the frequency division rate of the programmable frequency divider by providing switching terminals for selecting the triangle and saw tooth scanning and selectively switching these terminals. In advance of the detailed description of such embodiment, however, description will be made of the basic concept of the triangle scanning and saw tooth scanning with reference to FIG. 7.

Figure 7:
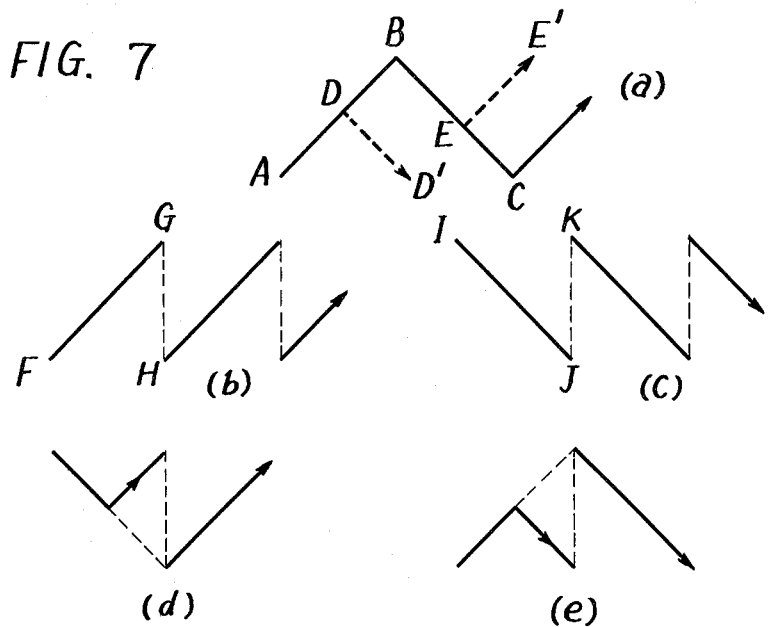
FIG. 7 shows various graphs for explaining the triangle scanning operation and the saw tooth scanning operation in accordance with the present invention.

Referring to FIG. 7, if and when the switching terminal has been switched to the triangle scanning state, depression of the upward scanning switch causes the scanning toward the maximum frequency, as shown in FIG. 7(a), and if and when the maximum frequency is reached, the scanning direction is automatically reversed to cause the scanning in the downward direction toward the minimum frequency, but the depression of the downward scanning switch causes the scanning toward the minimum frequency, and if and when the minimum frequency is reached, the scanning direction is reversed in the upward direction. If the downward scanning switch is depressed in the course of the upward scanning, or if the upward scanning switch is depressed in the course of the downward scanning, the scanning direction is forcibly changed to the scanning direction of the switch as depressed, as from D to D' or from E to E' in FIG. 7(a). If and when the switching terminal has been switched to the saw tooth scanning state, depression of the upward scanning switch causes the scanning toward the maximum frequency G, as shown in FIG. 7(b), and if and when the maximum frequency is reached, scanning is started again from the minimum frequency H toward the maximum frequency. On the other hand, depression of the downward scanning switch causes the scanning to start toward the minimum frequency J, as shown in FIG. 7(c), and if and when the minimum frequency is reached, the scanning is effected again this time from the maximum frequency K again in the downward direction. If and when the scanning switch of the opposite direction is depressed in the course of the scanning in the upward direction or the downward direction, the scanning direction is forcibly reversed to the scanning direction of the depressed switch, similarly to the case of the triangle scanning, whereby the saw tooth scanning is effected as shown in FIG. 7(d) and (e). In either case of the triangle scanning and the saw tooth scanning, the scanning direction can be selected as desired in the upward direction or downward direction by changing the manner of variation of the frequency division rate of the programmable frequency divider.

Figure 8:
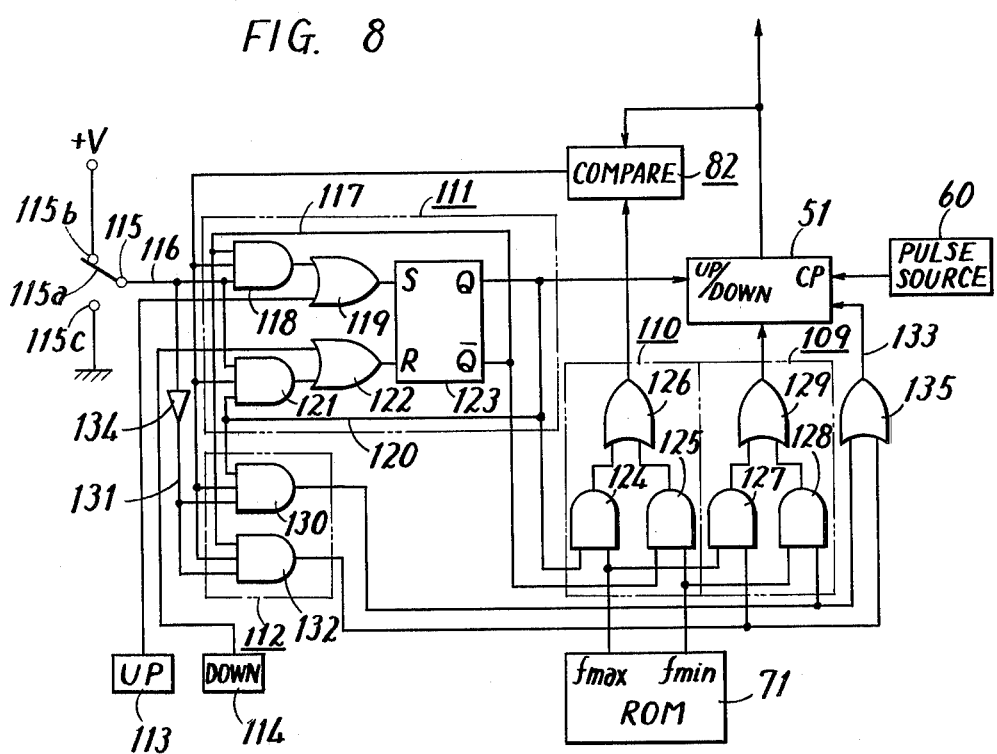
FIG. 8 is a detailed logic and block diagram of the characteristic portion of the second embodiment of the present invention.

FIG. 8 shows the second embodiment of the present invention which is based on the foregoing description of the concepts of the triangle scanning and the saw tooth scanning. Basically, the second embodiment shown is the same as the FIGS. 2 and 3 embodiment, FIG. 8 showing the characteristic portion of the second embodiment with emphasis placed on switching of the scanning. It is pointed out that the operation of only one band will be described in the following for simplicity of explanation and understanding of the embodiment. FIG. 8 is a detailed logic and block diagram of the second embodiment. For simplicity of explanation and understanding of the characteristic portion, the portions corresponding to those in FIGS. 2 and 3 are designated by the same reference characters, while a portion of the diagram has been shown in a simplified manner.

The FIG. 8 embodiment comprises an up/down mode selecting circuit 111 for controlling as desired the scanning direction (corresponding to the block 83 in FIG. 3) and a saw tooth scanning control 112 enabled only during the saw tooth scanning for controlling a gating circuit 109 so as to set the data concerning the maximum or minimum frquency from the read only memory 71 to the setting counter 51 if and when the minimum or the maximum frequency is reached. The said up/down mode selecting circuit 111 essentially corresponds to the block 83 in FIG. 3 and serves to control as desired the scanning direction of the setting counter 51 for setting the frequency division rate and to control the gating circuit 110 so as to provide from the read only memory 71 to the compare circuit 82 the data concerning the maximum and the minimum frequencies at the time of scanning in the upward and downward directions toward the maximum and minimum frequencies, respectively. The selecting circuit 111 comprises two AND gates 118 and 121, two OR gates 119 and 122 and a flip-flop 123. The output from the OR gate 119 is connected to the set input to the flip-flop 123 and the output from the OR gate 122 is connected to the rest input to the flip-flop 123. One input to the OR gate 119 is connected to the upward scanning switch 113 for selecting the upward direction and the other input to the OR gate 119 is connected to the output from the AND gate 118. One input to the OR gate 122 is connected to the downward scanning switch 114 for selecting the downward direction and the other input to the OR gate 122 is connected to the output from the AND gate 121. The AND gate 118 has three inputs, the first input being connected to the Q output of the flip-flop 123, the second input being connected to the output from the compare circuit 82 and the third input being connected to the terminal 115 for switching the triangle scanning and the saw tooth scanning. The AND gate 121 also has three inputs, the first input being connected to the Q output of the flip-flop 123, the second input being connected to the output from the compare circuit 82 and the third input being connected to the said switching terminal 115. As seen from the detailed description of the structure of the up/down mode selecting circuit 111, the AND gate 118 is enabled if and when the triangle scanning signal 116, downward mode signal 117 and the coincidence output from the compare circuit 82 are obtained simultaneously, thereby to provide the high level signal, and the said high level signal or the high level signal by depression of the upward scanning switch 113 causes the flip-flop 123 to be set, and the AND gate 121 is enabled if and when the triangle scanning signal 116, the upward mode signal 120 and the output from the coincidence circuit 82 are obtained simultaneously, thereby to provide the high level signal, and the said high level signal or the high level signal by depression of the downward scanning switch 114 causes the flip-flop 123 to be reset. The frequency division rate setting counter 51 is controlled to be operative as an up counter if and when the flip-flop 123 is set and as a down counter if and when the flip-flop 123 is reset.

The said saw tooth scanning control 112 comprises two AND gates 130 and 132. Each of the AND gates 130 and 132 has three inputs, the first input thereof being connected to the switch terminal 115 through the inverter 134, and the second input thereof being connected to the output from the compare circuit 82. The third input of the AND gate 130 is connected to the Q output of the flip-flop 123 and the third input of the AND gate 132 is connected to the Q output of the flip-flop 123. The output from the AND gate 130 is connected to one input to an AND gate 128 included in the gating circuit 109 to be described subsequently and is also connected to the setting counter 51 through the OR gate 135. The output from the AND gate 132 is connected to one input to an AND gate 127 included in the said gating circuit 109 and is also connected to the setting counter 51 through the OR gate 135.

Between the read only memory 71 and the counter 51 and the compare circuit 82 are provided gating circuits 109 and 110 which control application of the frequency information from the read only memory 71 to the counter 51 and the compare circuit 82. The gating circuit 109 comprises two AND gates 127 and 128 and an OR gate 129. One input to the AND gate 127 is connected to the upper limit frequency information output terminal fmax of the read only memory 71 and one input to the AND gate 128 is connected to the lower limit frequency information output terminal fmin of the read only memory 71. The outputs from the AND gates 127 and 128 are connected through an OR gate 129 to the counter 51. One input to the AND gate 124 of the gating circuit 110 is connected to the output Q of the flip-flop 123 and the other input thereto is connected to the said terminal fmax. Similarly, one input to the AND gate 125 of the gating circuit 110 is connected to the output Q of the flip-flop 123 and the other input thereto is connected to the said terminal fmin. The outputs from the AND gates 124 and 125 are applied through an OR gate 126 to the compare circuit 82.

The switching between the triangle scanning and the saw tooth scanning is effected by turning a movable member 115a of the switching terminal 115. The triangle scanning is achieved by connecting the movable member 115a to the stationary contact 115b connected to the driving potential, while the saw tooth scanning is achieved by connecting the movable member 115a to the stationary contact 115c connected to the ground potential. In case of the saw tooth scanning, the ground potential of normally the low level is inverted by means of the inverter 134 to be applied to the saw tooth scanning control 112.

Referring now to FIG. 8, description will be made of the operation thereof. For facility of explanation of the operation, consider an FM radio receiver adapted to receive the frequency range of 76-90 MHz. First description will be made of the state of triangle scanning wherein the switching terminal 115 is turned to one stationary contact 115b. In case where the upward scanning is effected toward the maximum frequency in such a state, the upward scanning switch 113 is operated and the output therefrom is applied through the OR gate 119 to the flip-flop 123 of the up/down mode selecting circuit 111, so that the flip-flop 123 is set and accordingly the up/down mode selecting circuit 111 is rendered in the upward scanning mode, while the counter 51 is responsive to the set output from the flip-flop 123 to be operative as an up counter. At the same time, the AND gate 124 of the gating circuit 110 is enabled by the set output from the flip-flop 123 and accordingly the information concerning the upper limit frequency of 90 MHz is applied from the read only memory 71 through the AND gate 124 and the OR gate 126 to the compare circuit 82. The set counter 51 makes an up count for each of the pulses obtained from the scanning circuit 60, whereby the frequency division rate by the programmable frequency divider is varied in turn, with the result that the scanning is achieved from the point A to the point B as shown in FIG. 7(a). If and when the broadcasting wave is received in the course of the scanning, the generation of the pulses by the scanning circuit 60 is discontinued, whereby the state of reception is maintained, as described previously.

If and when the maximum frequency of 90 MHz as at the point B is reached as a result of the upward scanning, the coincidence output is withdrawn from the compare circuit 82. As a result, it follows that only the AND gate 121 is enabled and the output therefrom is applied through the OR gate 122 to the flip-flop 123 to reset it. Accordingly, the up/down mode selecting circuit 111 is switched to the down mode and accordingly the frequency division rate setting counter 51 is switched to be operative as a down counter. The AND gate 125 of the gating circuit 110 is responsive to the reset output from the flip-flop 123 to be enabled, whereby the information concerning the minimum frequency (76 MHz) is applied from the read only memory 71 through the AND gate 125 and the OR gate 126 to the compare circuit 82. The counter 51 then makes down count in response to the pulses from the scanning circuit 60, so that the scanning is effected from the point B to the point C as shown in FIG. 7(a). If and when the minimum frequency is reached as a result of the downward scanning, then the AND gate 118 is enabled this time, whereby the flip-flop 123 is reversed to the set state. Thus, if and when the minimum or the maximum frequency is reached in the scanning operation, the manner of variation of the frequency division rate of the programmable frequency divider 40 is changed, whereupon the direction of the scanning operation is automatically reversed, thereby to achieve the so called triangle scanning.

Assuming that the downward scanning switch 114 is operated at the point D in the course of the upward scanning, the output from the switch 114 is applied through the OR gate 122 to the reset input of the flip-flop 123, whereby the flip-flop 123 is forced to be reset and the downward scanning in the direction D' is caused as shown in the dotted line in FIG. 7(a). If and when the upward scanning switch 113 is operated at the point E in the course of the downward scanning, the upward scanning is caused similarly in the direction E'. Thus, the direction of the scanning operation can be changed as desired with the inventive system.

Now description will be made of the saw tooth scanning state wherein the switching terminal 115 is switched to the other stationary contact 115c. If and when the upward scanning switch 113 is operated in this state, the flip-flop 123 is reset and the upward scanning is caused from the point F to the point G as shown in the FIG. 7 (b), in the similar manner described in conjunction with the triangle scanning. If and when the maximum frequency of 90 MHz at the point G is reached, only the AND gate 130 of the saw tooth scanning control 112 is enabled by the signal obtainable from the compare circuit 82. Accordingly the high level output from the AND gate 130 is applied to the AND gate 128 of the gating circuit 109 to enable it and is also applied through the OR gate 135 to the counter 51 as a preset enable signal 133. The counter 51 is responsive to the said present enable signal 133 to be loaded with the information concerning the minimum frequency (76 MHz) obtainable from the read only memory 71 through the AND gate 128 and the OR gate 129. Since the flip-flop 123 remains set at that time, the upward scanning is started again from the point H.

If and when the downward scanning switch 114 is operated, the flip-flop 123 is reset and the downward scanning is caused toward the minimum frequency as seen in FIG. 7(c). If and when the minimum frequency (76 MHz) at the point J is reached as a result of the downward scanning, the AND gate 132 is enabled this time in response to the coincidence output from the compare circuit 82. Accordingly, the high level output from the AND gate 132 is applied through the OR gate 135 to the counter 51 as a preset enable signal 133 and is also applied to the AND gate 127 to enable it. Therefore, the counter 51 is loaded with the information concerning the maximum frequency (90 MHz) obtainable from the read only memory 71 through the AND gate 127 and the OR gate 129. Since the flip-flop 123 remains reset at the time, the downward scanning is again started from the maximum frequency at the point of K. Assuming that the up or down scanning switch 113 or 114 is depressed in the course of the downward or upward scanning as shown in FIG. 7 (d) or (e), the flip-flop 123 is forcibly set or reset, whereby the direction of the scanning operation is reversed. If and when the maximum or mininum frequency is reached thereafter, the same saw tooth scanning is effected. Thus, in case of the saw tooth scanning as well, the direction of the scanning operation can be changed as desired by changing the manner of variation of the frequency division rate of the programmable frequency divider 40.

It is readily appreciated that in the sequential control of the second embodiment determination is made of only the upper limit (Fig. 7(b)) or the lower limit (Fig. 7(c)) in the state D of FIG. 4 in case of the saw tooth scanning and, for example, in case of the saw tooth scanning in FIG. 7 (b), upon determination of the upper limit the state P is regained and the count value in the counter is set to the lower limit. According to the second embodiment described in the foregoing, switching between the triangle type scanning and the saw tooth scanning is possible by simply switching the terminal 115, with the result that the manner of scanning can be freely selected in accordance with the desire of an operator.

The fundamental embodiment of the present invention described in the foregoing with reference to FIGS. 1 through 6 was structured such that if and when a given broadcasting station is received in the course of the scanning operation the scanning is tentatively stopped for a relatively short period of time, whereupon the scanning operation is started again. In general, such a system is preferred in that the system is adapted for the general purpose of the receiver. Nevertheless, in such a case where there are few broadcasting stations that can be received in a given area in a certain broadcasting band, such as an FM band, it is more preferred that the state of reception is established whenever a broadcasting station is received in the course of the scanning and the scanning is stopped. On the contrary, in case of a broadcasting band such as an AM band in which there are many broadcasting stations that can be received in a given area, it is preferred to adopt the above described tentative stopping system. Thus, it is much more preferred that a multiple-band receiver is structured to be capable of selecting either of the above described two systems. The third embodiment to be described in the following is aimed to meet such a requirement.

FIG. 8 is a block diagram of the said third embodiment. Since the third embodiment is basically similar to what was described with reference to FIGS. 2 and 3, the following description will be centered on only the characteristic portion of the third embodiment. The third embodiment comprises a scanning circuit 280 for generating the scanning pulses to be applied to the frequently division rate setting counter 51, a setting circuit 250 for setting whether supply of the scanning pulses is tentatively discontinued for cursory review of the broadcasting or purposefully discontinued for establishing the state of reception if and when a broadcasting station is received during the scanning operation as a result of control of the scanning circuit 280, a control 270 for controlling the setting circuit 250 and an inputting circuit 240 for withdrawing the signals in response to depression of the scanning switch and the scanning stop switch shown in FIG. 1. It is pointed out that the scanning circuit 280 corresponds to the scanning circuit 60 in FIGS. 2 and 3 and the inputting circuit 240 corresponds to the inputting circuit 100 in FIGS. 2 and 3.

The said scanning circuit 280 comprises an oscillator 281 for providing one low frequency pulse at every 100 milliseconds, an oscillator 282 for providing high frequency pulses between the said low frequency pulses, the number of which high frequency pulses corresponds to the inter-station frequency in the AM or FM band, and two AND gates 283 and 284 for withdrawing the scanning pulses to the counter 51. The said oscillator 281 is controlled in synchronism with a timing signal, not shown, as fully described previously in conjunction with the first basic embodiment of the present invention. The AND gate 283 serves to AND process the outputs from the said two oscillators 281 and 282 to supply the output therefrom to one input to the AND gate 284. The other input to the AND gate 284 is connected to the output from an AND gate 254 in the setting circuit 250. The said setting circuit 250 comprises a setting switch 251, first and second signal generators 252 and 253, respectively, implemented by monostable multivibrators, an inverter 255 for inverting the output from the said first signal generator 252, and the said AND gate 254. The setting switch 251 may be provided on the display panel DP in FIG. 1 and is aimed to set whether the scanning is tentatively discontinued or purposefully discontinued if and when a broadcasting station is received during the scanning operation. The contact 251C of the setting switch 251 is connected to the terminal R for receiving the reception output from the detecting circuit 34 in FIG. 2. In case where the reception signal is introduced through the terminal R during the scanning operation and the setting switch 251 has been set to the terminal 251a, the output is obtained from the first signal generator 252 for about five seconds. The said output is inverted by the inverter 255 and is applied to the AND gate 254 to disable it, which accordingly disables the AND gate 284 in the scanning circuit 280, whereby the scanning pulses are interrupted tentatively. On the other hand, in case where the switch 251 has been set to the terminal 251b the pulses are generated for a short time period from the second signal generator 253 to reset the flip-flop 275 in the control 270.

The said control 270 comprises flip-flops 275 and 276, AND gates 271 and 272, and OR gates 273 and 274. The set input of the flip-flop 275 is connected to the output from the OR gate 273, while the reset input of the flip-flop 275 is connected to the output from the OR gate 274. The input to the OR gate 273 is connected to the upward and downward scanning switches 241 and 242 in the inputting circuit 240. The first input to the OR gate 274 is connected to the scanning stop switch 243 in the inputting circuit 240, the second input to the OR gate 274 is connected to the output from the second signal generator 253 in the setting circuit 250, and the third input to the OR gate 274 is connected to the output from the said determination circuit 80. The output Q of the flip-flop 275 is connected to one input of the respective AND gates 254, 271 and 272. The set input of the second flip-flop 276 is connected to the said upward scanning switch 241 and the reset input of the flip-flop 276 is connected to the said downward scanning switch 242. The output Q of the flip-flop 276 is applied to the said counter 51 and is also applied to the other input to the AND gate 271, while the Q output of the flip-flop 276 is applied to the other input to the AND gate 272. As appreciated from the structure of the control circuit 270 described above, in response to the upward and downward scanning switches 241 and 242 and the stop switches 243 in the inputting circuit 240, the flip-flop 275 serves to store the state of the receiver whether it is in the scanning operation or not, while the flip-flop 276 serves to store the state of the receiver whether it is in the upward or downward scanning operation, whereby addition or subtraction achieved by the AND gate 254 in the setting circuit 250 and the counter 51 is controlled.

Figure 9:
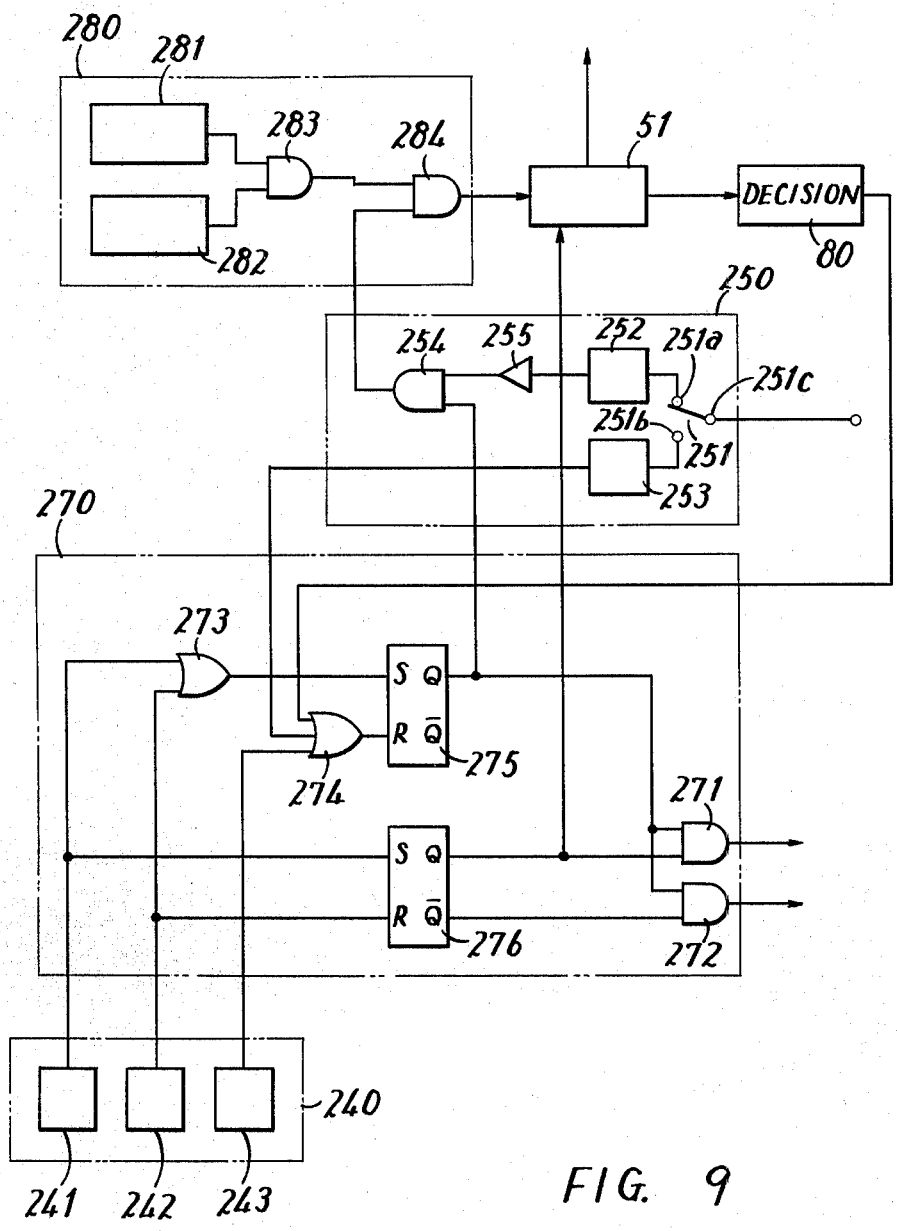
FIG. 9 is a block diagram of the characteristic portion of the third embodiment of the present invention.

With reference to FIG. 9, the operation of the third embodiment will be described in the following. First consider a case where the upward scanning switch 241 is depressed, whereby the upward scanning is achieved, and the setting switch 251 in the setting circuit 250 has been turned to the tentative stop side 251a. The flip-flop 275 is responsive to the depression of the scanning switch 241 through the OR gate 273, so that the flip-flop 275 is set, whereby the state of being in the scanning operation is stored. The set output of the flip-flop 275 is applied to the AND gate 254 in the setting circuit 250 to be rendered in an enabled state. If no reception signal is obtained, no output is withdrawn from the first signal generator 252 and thus the output of the inverter 255 is of the high level. Accordingly, the AND gate 254 is enabled and thus the AND gate 284 in the scanning circuit 280 is enabled. Accordingly, the scanning pulses are applied to the counter 51, thereby to achieve the scanning operation. If and when a broadcasting station is received in the course of the scanning operation, the first signal generator 252 is responsive to the input from the terminal R to generate the output for five seconds, which output is applied through the inverter 255 to the AND gate 254 to disable the same for five seconds and thus disable the AND gate 284 for five seconds. If and when the first signal generator 252 stops generating the signal, again the AND gate 254 is enabled, whereby the scanning operation is started again. If it is desired to establish the reception state to select the broadcasting station thus received, the stop switch 243 in the inputting ciccuit 240 is depressed. Accordingly, the flip-flop 275 is reset through the OR gate 274, and accordingly the AND gate 254 is disabled. Accordingly, the output from the first signal generator 252 is interrupted, so that even if the high level signal is applied through the inverter 255 to the AND gate 254, the AND gate 254 remains disabled and accordingly the AND gate 284 also remains disables. In other words, the scanning is purposefully discontinued, so that the reception state is established and maintained. In summary, if and when the setting switch 251 in the setting circuit 250 is set to the terminal 251a, the scanning operation is tentatively discontinued when a broadcasting station is received and the scanning operation is purposefully discontinued to establish the reception state if and when the broadcasting station thus received is to be selected and the stop switch is depressed during the said tentative stop period of the scanning.

Now consider a case where the setting switch 251 in the setting circuit 250 is set to the terminal 251b. The reception signal is introduced to the second signal generator 253 in the course of the scanning operation and the output from the second signal generator 253 is applied to the reset input of the flip-flop 275 through the OR gate 274, so that the flip-flop 275 is reset. Accordingly, the system functions as if the stop switch 243 were depressed in case of the above described tentative stop operation, and thus the reception state is established and maintained. If and when it is desired to select another broadcasting station, either of the upward and downward scanning switch 241 and 242 in the inputting circuit 240 is depressed, and the flip-flop 276 is again set, whereby the scanning operation is started again. The flip-flop 275 is also reset if and when the output is obtained from the determination circuit 80, whereby the scanning operation is also discontinued.

The sequence control of the third embodiment of the present invention may be described with reference to FIG. 4 such that one sequence state is provided in parallel with the state W of the sequence in FIG. 4 and if and when the said state is reached the reception state A is regained just like the case of depression of the stop switch on the occasion of the tentative stoppage, whereby the progress of the sequence is stopped. Whether the said state of the sequence is to be assumed or the said state W of the sequence is to be assumed if and when a broadcasting station is received is determined in advance through operation of the switch 251 for tentative stop or purposeful stop of the scanning.

As described in the foregoing, according to the third embodiment of the present invention, selection can be made whether the tentative stop of the scanning is achieved or the purposeful stop of the scanning is achieved, if and when a broadcasting station is received in the course of scanning operation, by simply setting the setting switch 251 of the setting circuit 250. The said setting switch 251 may be of a mechanical structure, or may be implemented by an electric circuit employing AND gates and inverters, or may be operatively coupled with the said band selecting switch 4 and 5 in FIG. 1. Since the direction of the scanning operation is stored by means of the flip-flop 276 of the control 270, the direction of the scanning operation can be displayed by the upward/downward direction indicator 2 in FIG. 1 provided in combination with the flip-flop 275 only during the scanning operation. For example, if and when the upward scanning switch 241 (corresponding to the switch UP in the block 6 in FIG. 1) is depressed, the flip-flop 275 is set and the scanning operation is started and simultaneously the flip-flop 276 is also set, so that the logical product is obtained by the AND gate 271. On the contrary, if and when the downward scanning switch 241 is depressed, the flip-flop 276 is reset, so that the AND gate 272 is enabled. The upward/ downward direction indicator 2 is responsive to the output from the said AND gates 271 and 272 to display the arrow of the upward or downward direction only during the scanning operation, with the result that the tentative stop state and the purposeful stop state can be clearly discriminated.

Although this invention has been described and illustrated in detail, it is to be clearly understood that the same is by way of illustration and example only and is not to be taken by way of limitation, the spirit and scope of this invention being limited only by the terms of the appended claims.

What is claimed is:

1. A superheterodyne receive, comprising means for receiving a high frequency signal, local oscillating means for providing an oscillation frequency signal the frequency of which is different by a given frequency difference from said received high frequency signal and mixing means responsive to said received high frequency signal and said local oscillation frequency signal for providing an intermediate frequency signal; said local oscillating means comprising voltage controlled oscillating means for providing said oscillation frequency signal the oscillation frequency of which is variable as a function of a given control voltage, means for modifying the oscillation frequency of the output from said voltage controlled oscillating means, means for controlling the rate of frequency modification of said oscillation frequency modifying means, and means responsive to the output from said oscillation frequency modifying means, as modified at the frequency modification rate controlled by said frequency modification rate controlling means, for providing a control voltage associated with the frequency of the output from said oscillation frequency modifying means to said voltage controlled oscillating means, whereby said local oscillating means is adapted to provide a local oscillation frequency signal the frequency of which is associated with the frequency modification rate, as controlled by said frequency modification rate controlling means, said receiver further comprising, means for inputting information concerning the manner of controlling the frequency modification rate by said frequency modification rate controlling means, means responsive to the information inputted by said inputting means for controlling sequentially the manner of controlling said frequency modification rate by said frequency modification rate controlling means, said sequential control means comprising means for generating timing signals, and means responsive to the information inputted by said inputting means and said timing signals obtainable from said timing signal generating means for providing a sequential control signal in synchronism with said timing signals, said timing signal generating means being adapted to be actuated in response to the information inputted by said inputting means, means responsive to said inputting means for accommodating the control of frequency modification rate by said frequency modification rate controling means for enabling reception of the frequencies in a given receiving frequency range, means for providing a signal representative of the tuning state by said receiver, and means for commanding a scanning operation by said receiver, said frequency modification rate controlling means comprising means responsive to said commond output from said scanning operation commanding means to be enabled to make variation of the frequency modification rate in a given direction and responsive to said signal representative of the tuning state by state receiver to be disabled, thereby to discontinue the variation of said frequency modification rate, said accommodating means comprising means for storing information concerning said given receiving frequency range, and means operatively coupled to said information storing means for controlling the variation range of said frequency modification rate variation means with said information concerning said given receiving frequency range.

2. A superheterodyne receiver in accordance with claim 1, in which said control voltage providing means comprises means for providing a reference frequency signal, and means responsive to the output from said oscillation freaquency modifying means and the output from said reference frequency signal providing means for detecting the frequency difference between he frequency of the output from said oscillation frequency modifying means and the frequency of said reference frequency signal for providing said control voltage to said voltage controlled oscillating means.

3. A superheterodyne receiver in accordance with claim 2, in which said oscillation frequency modifying means comprises means for dividing the frequency of the output from said voltage controlled oscillation means, and said means for controlling the frequency modification rate comprises means for controlling the rate of frequency division by said frequency dividing means.

4. A superheterodyne receiver in accordance with claim 1, in which said inputting means comprises
means for providing a signal for commanding a scanning operation for tuning by said receiver, and
said sequential control means is adapted to be responsive to said scanning command signal from said scanning command signal providing means.

5. A superheterodyne receiver in accordance with claim 4, in which said scanning command signal providing means comprises means for providing a signal for commanding the scanning operation in a given direction, and
said sequential control means comprises means for judging the limit of said scanning operation in said given direction for terminating the scanning operation in said given direction.

6. A superheterodyne receiver in accordance with claim 5, in which said sequential control means further comprises means responsive to judgement of the limit of scanning operation for reversing the direction of the scanning operation to the opposite direction.

7. A superheterodyne receiver in accordance with claim 6, in which said sequential control means further comprises means for judging the limit of the scanning operation in said opposite direction.

8. A superheterodyne receiver in accordance with claim 7, in which said sequential control means further comprises means for repeating said scanning opertion in said given direction and said opposite direction alternately.

9. A superheterodyne receiver in accordance with claim 5, in which said sequential control means further comprises means responsive to judgement of the limit of scanning operation in said given direction for starting the scanning operation from the initial limit of said scanning operation in said given direction.

10. A superheterodyne receiver in accordance with claim 9, in which said sequential control means further comprises means for repeating said scanning operation in said given direction.

11. A superheterodyne receiver in accordance with claim 1, in which said inputting means comprises means for commanding a presetting operation by said receiver, and
said sequential control means comprises means responsive to the command output from said preset commanding means for providing a signal for sequentially controlling said presetting operation.

12. A superheterodyne receiver in accordance with claim 11, in which said means for providing a signal for sequentially controlling said presetting operation comprises
means for storing information concerning the frequency of a predetermined broadcasting station, and
means responsive to said preset commanding means for reading said information stored in said station frequency store means for providing the same to said frequency modification rate controlling means.

13. A superheterodyne receiver in accordance with claim 12, in which said station frequency store means is adapted to be responsive to said preset command for storing the information concerning the frequency modification rate by said frequency modification rate controlling means.

14. A superheterodyne receiver in accordance with claim 4, in which said inputting means further comprises means for commanding stoppage of said scanning operation, and
said sequential control means comprises means responsive to said stop command for providing a signal for stoppage of said scanning operation.

15. A superheterodyne receiver in accordance with claim 14, in which said scanning stop command means comprises
means for tentatively stopping the scanning operation, and
means for continually stopping the scanning operation.

16. A superheterodyne receiver in accordance with claim 1, in which said command means comprises
means for commanding the upward variation, and
means for commanding the downward variation, and said frequency modification rate variation means comprises reversible variation means responsive to said upward variation command to cause an upward variation of the frequency modification rate and responsive to said downward variation command to cause a downward variation of the frequency modification rate.

17. A superheterodyne receiver in accordance with claim 16, in which said accommodating means further comprises state store means responsive to said upward variation command for assuming a first store state and responsive to the downward variation command for assuming a second store state and said frequency modification rate variation means is adapted to be responsive to the first state store output from said state store means for causing the upward variation and to be responsive to the second state output from said state store means for causing the downward variation.

18. A superheterodyne receiver in accordance with claim 17, in which said state store means is adapted to be responsive to the termination of the variation of the frequency modification rate by said frequency modification rate variation means in the upward direction for assuming a second store state and to be responsive to the termination of the variation of the frequency modification rate by said frequency modification rate variation means in the downward direction for assuming the first store state.

19. A superheterodyne receiver, comprising means for receiving a high frequency signal, local oscillating means for providing an oscillation frequency signal the frequency of which is different by a given frequency difference from said received high frequency signal and mixing means responsive to said received high frequency signal and said local oscillation frequency signal for providing an intermediate frequency signal; said local oscillating means comprising
voltage controlled oscillating means for providing for oscillation frequency signal the oscillation frequency of which is variable as a function of a given control voltage, means for modifying the oscillation frequency of the output from said voltage controlled oscillating means, means for controlling the rate of frequency modification of said oscillation frequency modifying means, and means responsive to the output from said oscillation frequency modifying means, as modified at the frequency modification rate controlled by said frequency modification rate controlling means, for providing a control voltage associated with the frequency of the output from said oscillation frequency modifying means to said voltage controlled oscillating means, whereby said local oscillating means is adapted to provide a local oscillation frequency signal the frequency of which is associated with the frequency modification rate, as controlled by said frequency modification rate controlling means, said receiver further comprising, means for inputting information concerning the manner of controlling the frequency modification rate by said frequency modification rate controlling means, said inputting means comprising means for selecting a plurality of receiving frequency bands, means responsive to the information inputted by said inputting means for controlling sequentially the manner of controlling said frequency modification rate by said frequency modification rate controlling means, said sequential control means comprising means responsive to the output from said band selecting means for accommodating the control of frequency modification rate by said frequency modification rate controlling means for enabling reception of the frequencies in the corresponding selected receiving frequency band, means for providing a signal representative of the tuning state by said receiver, and means for commanding a scanning operation by said receiver, said frequency modification rate controlling means comprising means responsive to said command output from said scanning operation commanding means to be enabled to make the variation of the frequency modification rate in a given direction and responsive to said signal representative of the tuning state by said receiver to be disabled, thereby to discontinue the variation of said frequency modification rate, said accommodating means comprising means for storing information concerning one extremity frequency of the frequency range of each of said plurality of receiving frequency bands, and means responsive to the band selecting output for controlling the variation range of said frequency modification rate variation means by initially setting said information concerning said one extremity frequency of the frequency range of the corresponding selected receiving frequency band in said frequency modification rate variation means.

20. A superheterodyne receiver in accordance with claim 19, in which said sequential control means comprises means for generating timing signals, and means responsive to the information inputted by said inputting means and said timing signals obtainable from said timing signal generating means for providing sequential control signals in synchronism with said timing signals.

21. A superheterodyne receiver in accordance with claim 20, in which said timing signal generating means is adapted to be activated in response to the information inputted by said inputting means.

22. A superheterodyne receiver in accordance with claim 19, in which said information concerning the frequency range obtainable from said store means further comprises information concerning the other extremity frequency of the respective receiving frequency band, and said controlling means further comprises means responsive to information concerning said one and the other extremity frequencies of the corresponding receiving frequency band and responsive to the output from said frequency modification rate variation means for terminating the variation of frequency modification rate by said frequency modification rate variation means when the variation by said frequency modification rate variation means reaches the value corresponding to said one and the other frequencies of the corresponding receiving frequency band.

23. A superheterodyne receiver in accordance with claim 22, in which said command means comprises means for commanding the upward variation, and means for commanding the downward variation, and said frequency modification rate variation means comprises reversible variation means responsive to said upward variation command to cause an upward variation of the frequency modification rate and responsive to said downward variation command to cause a downward variation of the frequency modification rate.

24. A superheterodyne receiver in accordance with claim 23, in which said accommodating means further comprises state store means responsive to said upward variation command for assuming a first store state and responsive to the downward variation command for assuming a second store state and said frequency modification rate variation means is adapted to be responsive to the first state store output from said state store means for causing the upward variation and to be responsive to the second store state output from said state store means for causing the downward variation.

25. A superheterodyne receiver in accordance with claim 24, in which said state store means is adapted to be responsive to the termination of the variation of the frequency modification rate by said frequency modification rate variation means in the upward direction for assuming a second store state and to be responsive to the termination of the variation of the frequency modification rate by said frequency modification rate variation means in the downward direction for assuming the first store state.

26. A superheterodyne receiver in accordance with claim 19 in which said control voltage providing means comprises means for providing a reference frequency signal, and means responsive to the output from said oscillation frequency modifying means and the output from said reference frequency signal providing means for detecting the frequency difference between the frequency of the output from said oscillation frequency modifying means and the frequency of said reference frequency signal for providing said control voltage to said voltage controlled oscillating means.

27. A superheterodyne receiver in accordance with claim 26, in which said oscillation frequency modifying means comprises means for dividing the frequency of the output from said voltage controlled oscillating means, and said means for controlling the frequency modification rate comprises means for controlling the rate of frequency division by said frequency dividing means.

28. A superheterodyne receiver in accordance with claim 19, in which said inputting means comprises
   means for providing a signal for commanding a scanning operation for tuning by said receiver, and
   said sequential control means is adapted to be responsive to said scanning command signal from said scanning command signal providing means.

29. A superheterodyne receiver in accordance with claim 28, in which said scanning command signal providing means comaprises means for providing a signal for commanding the scanning operation in a given direction, and
   said sequential control means comprises means for judging the limit of said scanning operation in said given direction for terminating the scanning operation in said given direction.

30. A superheterodyne receiver in accordance with claim 29, in which said sequential control means further comprises means responsive to judgment of the limit of scanning operation for reversing the direction of the scanning operation to the opposite direction.

31. A superheterodyne receiver in accordance with claim 30, in which said sequential control means further comprises means for judging the limit of the scanning operation in said opposite direction.

32. A superheterodyne receiver in accordance with claim 31, in which said sequential control means further comprises means for repearting said scanning operation in said given direction and said opposite direction alternately.

33. A superheterodyne receiver in accordance with claim 29, in which said sequential control means further comprises means responsive to judgment of the limit of scanning operation in said given direction for starting the scanning operation from the initial limit of said scanning operation in said given direction.

34. A superheterodyne receiver in accordance with claim 33, in which said sequential control means further comprises means for repeating said scanning operation in said given direction.

35. A superheterodyne receiver in accordance with claim 19 in which said inputting means comprises means for commanding a presetting operation by said receiver, and
   said sequential control means comprises means responsive to the command output from said preset commanding means for providing a signal for sequentially controlling said presetting operation.

36. A superheterodyne receiver in accordance with claim 35, in which said means for providing a signal for sequentially controlling said presetting operation comprises
   means for storing information concerning the frequency of a predetermined broadcasting station, and
   means responsive to said preset commanding means for reading said information stored in said store means for providing the same to said frequency modification rate controlling means.

37. A superheterodyne receiver in accordance with claim 36, in which said store means is adapted to be responsive to said preset command for storing the information concerning the frequency modification rate by said frequency modification rate controlling means.

38. A superheterodyne receiver in accordance with claim 28, in which said inputting means further comprises means for commanding stoppage of said scanning operation, and
   said sequential control means comprises means responsive to said stop command for providing a signal for stoppage of said scanning operation.

39. A superheterodyne receiver in accordance with claim 38, in which said scanning stop command means comprises
   means for tentatively stopping the scanning operation, and
   means for continually stopping the scanning operation.

* * * * *